US012813099B2

(12) United States Patent

Tian et al.

(10) Patent No.: US 12,813,099 B2

(45) Date of Patent: Nov. 24, 2026

(54) DISPLAY SUBSTRATE INCLUDING BLANK REGION, WINDING REGION AND CIRCUIT REGION, AND ELECTRONIC APPARATUS INCLUDING DISPLAY SUBSTRATE

(71) Applicants: Chengdu BOE Optoelectronics Technology Co., Ltd., Chengdu (CN); BOE TECHNOLOGY GROUP CO., LTD., Beijing (CN)

(72) Inventors: Xuewei Tian, Beijing (CN); Fei Fang, Beijing (CN); Hui Lu, Beijing (CN); Wei Wang, Beijing (CN); Feng Qu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 667 days.

(21) Appl. No.: 17/920,122

(22) PCT Filed: Oct. 22, 2021

(86) PCT No.: PCT/CN2021/125663

§ 371 (c)(1),
(2) Date: Oct. 20, 2022

(87) PCT Pub. No.: WO2023/065296

PCT Pub. Date: Apr. 27, 2023

(65) Prior Publication Data

US 2024/0298482 A1 Sep. 5, 2024

(51) Int. Cl.
*H10K 59/131* (2023.01)

(52) U.S. Cl.
CPC .................................. *H10K 59/131* (2023.02)

(58) Field of Classification Search
CPC .. H10K 59/131; H10K 59/65; H10K 59/8051; H10K 77/10; G09G 3/20;
(Continued)

(56) References Cited

U.S. PATENT DOCUMENTS 8,212,252 B2 * 7/2012 Den ..................... H10D 86/423
257/62
10,916,186 B2 2/2021 Hsieh et al.
(Continued)

FOREIGN PATENT DOCUMENTS

CN 109767689 A 5/2019
CN 110010051 A 7/2019
(Continued)

OTHER PUBLICATIONS

Cai et al., Machine Translation of Foreign Patent Document CN 110874990, Display panel and display device, Mar. 10, 2020, pp. 1-31 (Year: 2020).*

(Continued)

*Primary Examiner* — Amr A Awad
*Assistant Examiner* — Maheen I Javed
(74) *Attorney, Agent, or Firm* — HOUTTEMAN LAW LLC

(57) ABSTRACT

A display substrate has a display region including a functional region and a main display region; the functional region has at least one functional unit, each of which has a blank region, a winding region and a circuit region; the display substrate includes a base substrate, and plural conductive layers on the base substrate; the plural conductive layers form at least one hollow pattern, each of which is in the blank region; the conductive layers include a first signal line, which includes first, second and third line segments in the main display region, the circuit region and the winding region, respectively; extending directions of the first and
(Continued)

second line segments are the same, the third line segment electrically connects the first and second line segments together, and the third line segment includes at least two line sub-segments with different extending directions.

20 Claims, 17 Drawing Sheets

(58) Field of Classification Search
CPC ... G09G 2300/0426; G09G 2310/0281; G09G 3/3233
See application file for complete search history.

(56) References Cited

U.S. PATENT DOCUMENTS

| | | | | |
|---|---|---|---|---|
| 2007/0253354 | A1* | 11/2007 | Sakong | H04H 40/18 370/328 |
| 2020/0343314 | A1* | 10/2020 | Nakamura | H10K 59/8792 |
| 2020/0381492 | A1 | 12/2020 | Ryu et al. | |
| 2021/0066409 | A1 | 3/2021 | Fan | |
| 2021/0202592 | A1* | 7/2021 | Kim | H10K 59/38 |
| 2022/0020321 | A1* | 1/2022 | Jung | G09G 3/2003 |
| 2022/0157860 | A1 | 5/2022 | Zhu et al. | |

FOREIGN PATENT DOCUMENTS

| | | | | | |
|---|---|---|---|---|---|
| CN | 110208994 | A | | 9/2019 | |
| CN | 110504289 | A | | 11/2019 | |
| CN | 110874990 | A | * | 3/2020 | G09F 9/302 |
| CN | 110957344 | A | | 4/2020 | |
| CN | 111081141 | A | | 4/2020 | |
| CN | 111370441 | A | | 7/2020 | |
| CN | 111863900 | A | | 10/2020 | |
| CN | 112016382 | A | | 12/2020 | |
| CN | 112419901 | A | | 2/2021 | |
| CN | 112599580 | A | | 4/2021 | |
| CN | 112750869 | A | | 5/2021 | |
| CN | 113160742 | A | | 7/2021 | |
| CN | 113451358 | A | * | 9/2021 | |
| JP | 2002189227 | A | | 7/2002 | |
| KR | 20200036137 | A | | 4/2020 | |
| KR | 20210052724 | A | | 5/2021 | |

OTHER PUBLICATIONS

European Patent Office, Extended European Search Report, Jul. 12, 2024, for corresponding EP application 21961044.1.
Korea Office, First Office Action, Nov. 28, 2025, for corresponding KR application No. 10-2023-7042929.

* cited by examiner

DISPLAY SUBSTRATE INCLUDING BLANK REGION, WINDING REGION AND CIRCUIT REGION, AND ELECTRONIC APPARATUS INCLUDING DISPLAY SUBSTRATE

TECHNICAL FIELD

The present disclosure belongs to the technical field of display, and particularly relates to a display substrate and an electronic apparatus.

BACKGROUND

With the advancement of technology, a special-shaped screen and a full screen have gradually entered people's field of vision in recent years. Both the special-shaped screen and the full screen are designed to improve a screen proportion of the display device. Then, in order to achieve a higher screen proportion, it is necessary to reserve some opening regions (e.g., holes) for some additional components (e.g., a camera, a sensor, etc.) at some positions of the display screen.

With the development and updating of display technology, an organic electroluminescent display (OLED) device has become a mainstream product in the display field due to its characteristics of self-luminescence, high brightness, high contrast, low operating voltage, and capability of manufacturing a flexible display.

SUMMARY

The present disclosure aims to solve at least one technical problem in the prior art and provides a display substrate and an electronic apparatus.

In a first aspect, an embodiment of the present disclosure provides a display substrate having a display region, where the display region includes a functional region and a main display region surrounding the functional region; the functional region has at least one functional unit; each of the at least one functional unit has a blank region, a winding region and a circuit region; the display substrate includes a base substrate, and a plurality of conductive layers on the base substrate; the plurality of conductive layers form at least one hollow pattern, and each of the at least one hollow pattern is in the blank region;

- the plurality of conductive layers include a first signal line, and the first signal line includes a first line segment in the main display region, a second line segment in the circuit region and a third line segment in the winding region;
- where extending directions of the first line segment and the second line segment are the same, the third line segment electrically connects the first line segment and the second line segment together, and the third line segment includes at least two line sub-segments with different extending directions.

In the functional unit, the winding region surrounds the blank region, and the circuit region surrounds the winding region; and the first line segment, the second line segment and the third line segment of the first signal line are directly and electrically connected together.

The plurality of conductive layers include a first conductive layer and a second conductive layer on the base substrate;

- the first conductive layer includes first type signal lines each having a main body part extending in a first direction, and the first type signal lines include a first sub-type signal line and a second sub-type signal line; the first sub-type signal line is only in the main display region; and the second sub-type signal line is in both the main display region and the winding region;
- the second conductive layer includes second type signal lines each having a main body part extending in a second direction, and the second type signal lines include a third sub-type signal line and a fourth sub-type signal line; the third sub-type signal line is only in the main display region; and the fourth sub-signal line is in both the main display region and the winding region; and
- the first signal line includes the second sub-type signal line and/or the fourth sub-type signal line.

The third line segment includes a first line sub-segment extending in the first direction and a second line sub-segment extending in the second direction.

The first line sub-segment and the second line sub-segment of the third line segment are directly electrically connected together.

The first conductive layer includes the first line sub-segment, the second conductive layer includes the second line sub-segment, and the first line sub-segment and the second line sub-segment of the third line segment are electrically connected together through a via penetrating through an interlayer insulating layer.

The first signal line is the second sub-type signal line, and the second sub-type signal line is arranged in mirror symmetry, taking a straight line passing through a center of the functional region and extending in the first direction as a symmetry axis; or the first signal line is the fourth sub-signal line, and the fourth sub-signal line is arranged in mirror symmetry, taking a straight line passing through the center of the functional region and extending in the second direction as a symmetry axis.

The first type signal lines include at least one of a gate line, a reset signal line, and a light emitting control line.

The second type signal lines include at least one of a data line, an initial signal line, and a power supply signal line.

A spacing between the third signal lines is less than a spacing between the first signal line segments.

The display substrate further includes pixel driving circuits in the main display region and the circuit region, where a distribution density of the pixel driving circuits in the main display region is the same as a distribution density of the pixel driving circuits in the circuit region.

The display substrate further includes light emitting devices in the main display region and the functional region, where the light emitting devices each include an anode on the base substrate; for the light emitting devices of a same emission color, an area of the anode of the light emitting device in the main display region is less than an area of the anode of the light emitting device in the functional region.

A part of the anodes of the light emitting devices partially cover the blank region.

In a second aspect, an embodiment of the present disclosure provides an electronic apparatus, including a display substrate and a functional component, where the functional component is on a side of the display substrate away from a light emitting surface; the display substrate has a display region, and the display region includes a functional region and a main display region surrounding the functional region; the functional region has at least one functional unit; each of the at least one functional unit has a blank region, a winding region and a circuit region; the display substrate includes a base substrate, and a plurality of conductive layers on the base substrate; the plurality of conductive layers form at least one hollow pattern, and each of the at least one hollow pattern is in the blank region;

the plurality of conductive layers include a first signal line, and the first signal line includes a first line segment in the main display region, a second line segment in the circuit region and a third line segment in the winding region;

extending directions of the first line segment and the second line segment are the same, the third line segment electrically connects the first line segment and the second line segment together, and the third line segment includes at least two line sub-segments with different extending directions; and the functional component at least partially overlap the hollow pattern.

In the functional unit, the winding region surrounds the blank region, and the circuit region surrounds the winding region; and the first line segment, the second line segment and the third line segment of the first signal line are directly and electrically connected together.

The plurality of conductive layers include a first conductive layer and a second conductive layer on the base substrate;

the first conductive layer includes first type signal lines each having a main body part extending in a first direction, and the first type signal lines include a first sub-type signal line and a second sub-type signal line; the first sub-type signal line is only in the main display region; and the second sub-type signal line is in both the main display region and the winding region;

the second conductive layer includes second type signal lines each having a main body part extending in a second direction, and the second type signal lines include a third sub-type signal line and a fourth sub-type signal line; the third sub-type signal line is only in the main display region; and the fourth sub-signal line is in both the main display region and the winding region;

the first signal line includes the second sub-type signal line and/or the fourth sub-type signal line; and orthographic projections of the functional component and the first signal line on the base substrate do not overlap each other.

The third line segment includes a first line sub-segment extending in the first direction and a second line sub-segment extending in the second direction.

The first line sub-segment and the second line sub-segment of the third line segment are directly electrically connected together.

The first conductive layer includes the first line sub-segment, the second conductive layer includes the second line sub-segment, and the first line sub-segment and the second line sub-segment of the third line segment are electrically connected together through a via penetrating through an interlayer insulating layer.

The first signal line is the second sub-type signal line, and the second sub-type signal line is arranged in mirror symmetry, taking a straight line passing through a center of the functional region and extending in the first direction as a symmetry axis; or the first signal line is the fourth sub-signal line, and the fourth sub-signal line is arranged in mirror symmetry, taking a straight line passing through the center of the functional region and extending in the second direction as a symmetry axis.

The first signal line includes at least one of a gate line, a reset signal line, and a light emitting control line.

The second type signal line includes at least one of a data line, an initial signal line and a power supply signal line.

A spacing between the third signal lines is less than a spacing between the first signal line segments.

The display substrate further includes pixel driving circuits in the main display region and the circuit region, where a distribution density of the pixel driving circuits in the main display region is the same as a distribution density of the pixel driving circuits in the circuit region.

The display substrate further includes light emitting devices in the main display region and the functional region, where a distribution density of the light emitting devices in the main display region is greater than a distribution density of the light emitting devices in the functional region.

The display substrate further includes light emitting devices in the main display region and the functional region, where the light emitting devices each include an anode on the base substrate; for the light emitting devices of a same emission color, an area of the anode of the light emitting device in the main display region is less than an area of the anode of the light emitting device in the functional region.

A part of the anodes of the light emitting devices partially cover the blank region; and orthographic projections of the functional component and the anode on the base substrate do not overlap each other.

DETAIL DESCRIPTION OF EMBODIMENTS

In order to enable one of ordinary skill in the art to better understand the technical solutions of the present disclosure, the present disclosure will be further described in detail below with reference to the accompanying drawings and specific embodiments.

Unless defined otherwise, technical or scientific terms used herein shall have the ordinary meaning as understood by one of ordinary skill in the art to which this disclosure belongs. The use of “first”, “second”, and the like in the present disclosure is not intended to indicate any order, quantity, or importance, but rather serves to distinguish one element from another. Also, the term “a”, “an”, “the” or the like does not denote a limitation of quantity, but rather denotes the presence of at least one. The word “comprising”, “comprises”, or the like means that the element or item preceding the word includes the element or item listed after the word and its equivalent, but does not exclude other elements or items. The term “connected”, “coupled” or the like is not restricted to physical or mechanical connections, but may include electrical connections, whether direct or indirect. The terms “upper”, “lower”, “left”, “right”, and the like are used only to indicate relative positional relationships, and when the absolute position of the object being described is changed, the relative positional relationships may also be changed accordingly.

Figure 1:
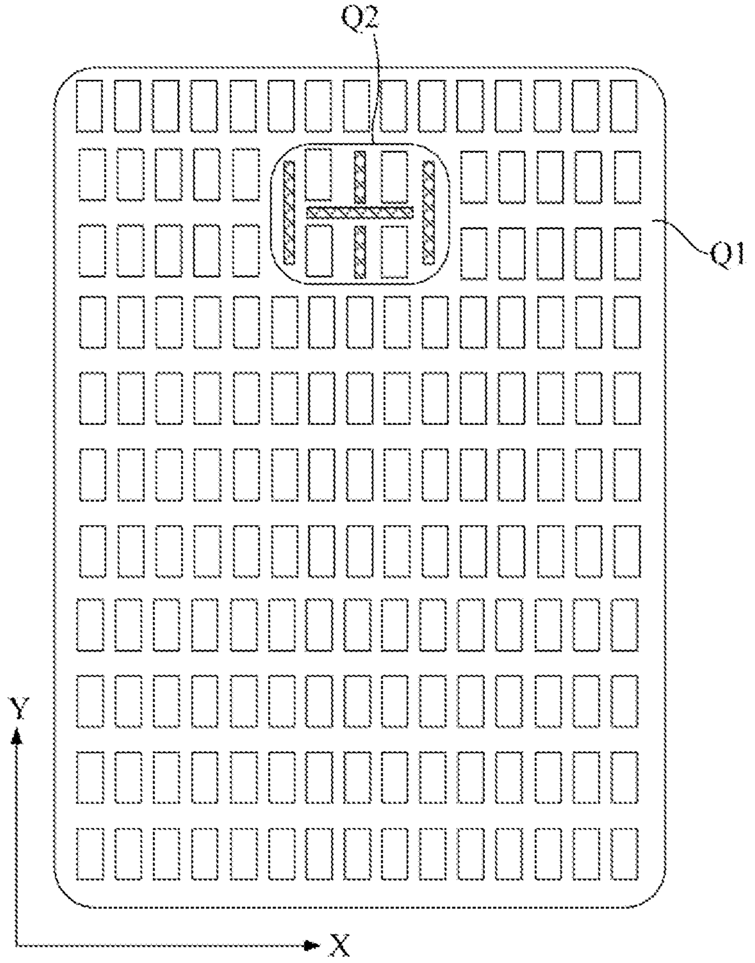
FIG. 1 is a schematic view of a distribution of regions of a display substrate.

With the development of display technology, users have more and more functional requirements on a display panel, such as integrating a series of functional elements in a display region of the display panel, that is, presetting a functional region in the original display panel, so as to form the functional elements later, as shown in FIG. 1.

However, in order to ensure that the display uniformity of the display panel is not affected with the functional elements in the display region, display elements, such as pixel driving circuits, light emitting devices, or the like, are still arranged in the functional region. It should be understood, however, that the display elements arranged in the functional region should not affect an operation of the functional elements. That is, the spacing between the pixel driving circuits, the light emitting devices, or the like, in the functional region will define a blank region where the functional elements are located. Due to the arrangement of the blank region in the functional region, the pixel driving circuit and the light emitting device cannot be arranged at this position, so that signal lines on two opposite sides of the blank region cannot pass through the blank region to be connected, and the display elements in the functional region cannot work normally.

In view of the above problem, a structure of a display substrate is provided in an embodiment of the present disclosure. In order to make the structure of the display substrate clearer, a pixel driving circuit and a light emitting device adopted in the display substrate, and a relationship between film layers of the pixel driving circuit and the light emitting device are first described.

Figure 2A:
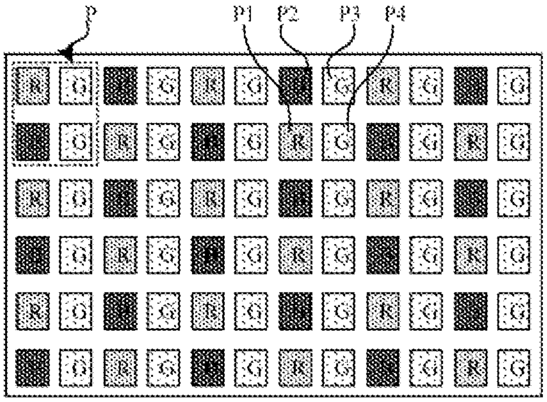
FIG. 2*a* is a schematic plan view of a structure of a display substrate.
Figure 2B:
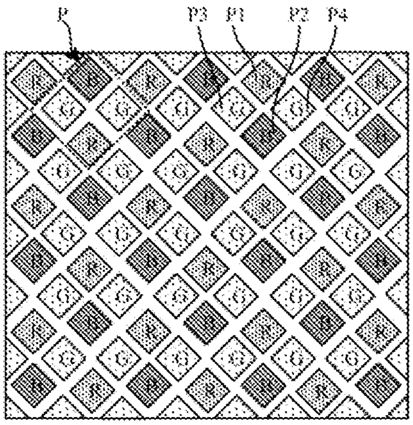
FIG. 2*b* is a schematic plan view of a structure of another display substrate.

FIGS. 2*a* and 2*b* each are a schematic plan view of a structure of a display substrate. In an exemplary embodiment, the display substrate may include a plurality of pixel units P arranged in a matrix. At least one of the plurality of pixel units P may each include one first sub-pixel P1 emitting light of a first color, one second sub-pixel P2 emitting light of a second color, and two sub-pixels, i.e., one third sub-pixel P3 and one fourth sub-pixel P4 emitting light of a third color. The four sub-pixels may each include a pixel driving circuit and a light emitting device. The pixel driving circuit may include a scanning signal line, a data signal line, and a light emitting signal line. The pixel driving circuit is connected to the scanning signal line, the data signal line, and the light emitting signal line, and the pixel driving circuit is configured to receive a data voltage transmitted from the data signal line and output a corresponding current to the light emitting device under the control of the scanning signal line and the light emitting signal line. The light emitting device in each sub-pixel is connected to the pixel driving circuit of the sub-pixel, and the light emitting device is configured to emit light with corresponding brightness in response to the current output by the pixel driving circuit of the sub-pixel.

In some examples, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may each be a green sub-pixel (G) emitting green light. In an exemplary embodiment, the shape of the sub-pixel may be a rectangle, a diamond, a pentagon, or a hexagon. In an exemplary embodiment, the four sub-pixels may be arranged in a square format to form a GGRB pixel arrangement, as shown in FIG. 2*a*. In another exemplary embodiment, the four sub-pixels may be arranged in a diamond format to form a RGBG pixel arrangement, as shown in FIG. 2*b*. In other exemplary embodiments, the four sub-pixels may be arranged in a horizontal or vertical parallel format. In an exemplary embodiment, the pixel unit may include three sub-pixels, and the three sub-pixels may be arranged in a horizontal parallel format, a vertical parallel format, or a delta format, which are not limited in the present disclosure.

In some examples, a plurality of sub-pixels sequentially arranged in a horizontal direction are referred to as a pixel row, a plurality of sub-pixels sequentially arranged in a vertical direction are referred to as a pixel column, and a plurality of pixel rows and a plurality of pixel columns constitute a pixel array arranged in an array.

Figure 3:
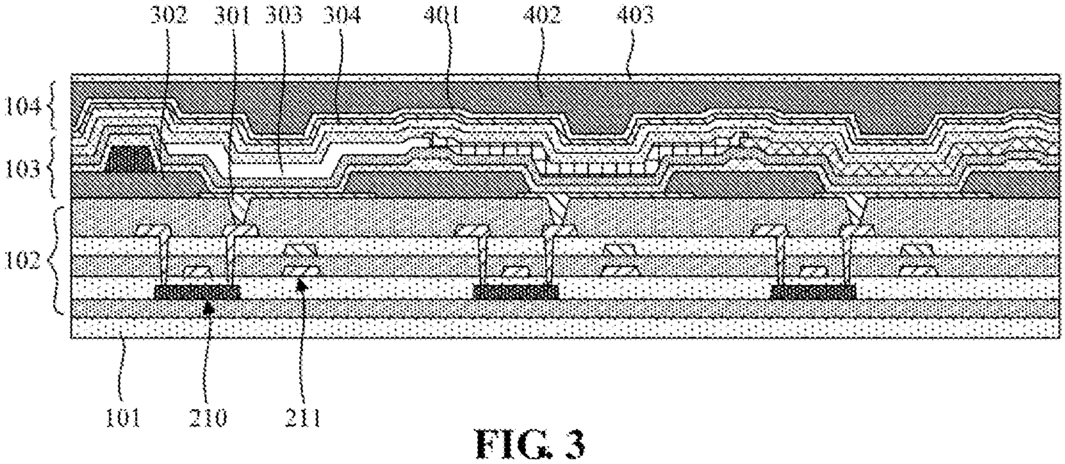
FIG. 3 is a schematic cross-sectional view of a structure of a display substrate.

FIG. 3 is a schematic cross-sectional view of a display substrate, illustrating a structure of three sub-pixels of the display substrate. As shown in FIG. 3, in a plane perpendicular to the display substrate, the display substrate may include a driving circuit layer 102 arranged on a base substrate 101, a light emitting structure layer 103 arranged on a side of the driving circuit layer 102 away from the base substrate, and an encapsulation layer 104 arranged on a side of the light emitting structure layer 103 away from the base substrate. In some possible implementations, the display substrate may include other film layers, such as spacer pillars, and the like, which are not limited in the present disclosure.

In an exemplary embodiment, the base substrate 101 may be a flexible substrate, or a rigid substrate. The driving circuit layer 102 of each sub-pixel may include a plurality of signal lines and a pixel driving circuit. The pixel driving circuit may include a plurality of transistors and a storage capacitor, which are illustrated in FIG. 3 by taking only one driving transistor 210 and one storage capacitor 211 as an example. The light emitting structure layer 103 of each sub-pixel may include a plurality of film layers constituting a light emitting device, and the plurality of film layers may include an anode 301, a pixel defining layer 302, an organic light emitting layer 303, and a cathode 304. The anode 301 is connected to a drain electrode of the driving transistor 210 through a via. The organic light emitting layer 303 is connected to the anode 301. The cathode 304 is connected to the organic light emitting layer 303. The organic light emitting layer 303 emits light of a corresponding color under the driving of the anode 301 and the cathode 304. The encapsulation layer 104 may include a first encapsulation layer 401, a second encapsulation layer 402, and a third encapsulation layer 403, which are stacked together. The first encapsulation layer 401 and the third encapsulation layer 403 may be made of an inorganic material, and the second encapsulation layer 402 may be made of an organic material. The second encapsulation layer 402 is arranged between the first encapsulation layer 401 and the third encapsulation layer 403, so as to ensure that external moisture cannot enter the light emitting structure layer 103.

In an exemplary embodiment, the organic light emitting layer 303 may include a hole injection layer (HIL), a hole transport layer (HTL), an electron blocking layer (EBL), an emission layer (EML), a hole blocking layer (HBL), an electron transport layer (ETL), and an electron injection layer (EIL), which are stacked together. In an exemplary embodiment, the hole injection layers and the electron injection layers of all the sub-pixels may each be an interconnected common layer, the hole transport layers and the electron transport layers of all the sub-pixels may each be an inter-connected common layer, the hole blocking layers of all the sub-pixels may be an inter-connected common layer, and the emission layers of two adjacent sub-pixels may overlap slightly, or may be isolated from each other, and the electron blocking layers of two adjacent sub-pixels may overlap slightly, or may be isolated from each other.

Figure 4:
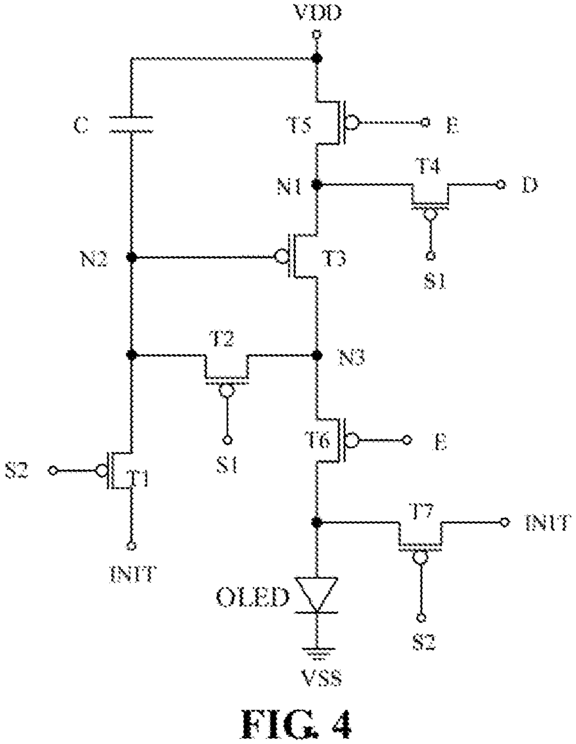
FIG. 4 is an equivalent circuit diagram of a pixel driving circuit.

In some examples, the pixel driving circuit may be a 3T1C, 4T1C, 5T1C, 5T2C, 6T1C, 7T1C, or 8T1C structure. FIG. 4 is an equivalent circuit diagram of a pixel driving circuit. As shown in FIG. 4, the pixel driving circuit may include seven transistors (a first transistor T1, a second transistor T2, a third transistor T3, a fourth transistor T4, a fifth transistor T5, a sixth transistor T6, and a seventh transistor T7) and one storage capacitor C. The pixel driving circuit is connected to seven signal lines (a data signal line D, a first scanning signal line S1, a second scanning signal line S2, a light emitting signal line E, an initial signal line INIT, a first power supply line VDD, and a second power supply line VSS).

In an exemplary embodiment, the pixel driving circuit may include a first node N1, a second node N2, and a third node N3. The first node N1 is connected to a first electrode of the third transistor T3, a second electrode of the fourth transistor T4 and a second electrode of the fifth transistor T5. The second node N2 is connected to a second electrode of the first transistor T1, a first electrode of the second transistor T2, a control electrode of the third transistor T3 and a second terminal of the storage capacitor C. The third node N3 is connected to a second electrode of the second transistor T2, a second electrode of the third transistor T3 and a first electrode of the sixth transistor T6.

In an exemplary embodiment, a first terminal of the storage capacitor C is connected to the first power supply line VDD, and the second terminal of the storage capacitor C is connected to the second node N2, that is, the second terminal of the storage capacitor C is connected to the control electrode of the third transistor T3.

A control electrode of the first transistor T1 is connected to the second scanning signal line S2, a first electrode of the first transistor T1 is connected to the initial signal line INIT, and the second electrode of the first transistor T1 is connected to the second node N2. When a scanning signal of a turn-on level is applied to the second scanning signal line S2, the first transistor T1 transmits an initial voltage to the control electrode of the third transistor T3 to initialize charges at the control electrode of the third transistor T3.

A control electrode of the second transistor T2 is connected to the first scanning signal line S1, the first electrode of the second transistor T2 is connected to the second node N2, and the second electrode of the second transistor T2 is connected to the third node N3. When a scanning signal of a turn-on level is applied to the first scanning signal line S1, the second transistor T2 connects the control electrode of the third transistor T3 to the second electrode.

The control electrode of the third transistor T3 is connected to the second node N2, that is, the control electrode of the third transistor T3 is connected to the second terminal of the storage capacitor C. The first electrode of the third transistor T3 is connected to the first node N1, and the second electrode of the third transistor T3 is connected to the third node N3. The third transistor T3 may be referred to as a driving transistor, and the third transistor T3 determines a magnitude of a driving current flowing between the first power supply line VDD and a second power supply line VSS according to a potential difference between the control electrode and the first electrode of third transistor T3.

A control electrode of the fourth transistor T4 is connected to the first scanning signal line S1, a first electrode of the fourth transistor T4 is connected to the data signal line D, and the second electrode of the fourth transistor T4 is connected to the first node N1. The fourth transistor T4 may be referred to as a switch transistor, a scanning transistor, or the like. When a scanning signal of a turn-on level is applied to the first scanning signal line S1, the fourth transistor T4 inputs a data voltage of the data signal line D to the pixel driving circuit.

A control electrode of the fifth transistor T5 is connected to the light emitting signal line E, a first electrode of the fifth transistor T5 is connected to the first power supply line VDD, and the second electrode of the fifth transistor T5 is connected to the first node N1. A control electrode of the sixth transistor T6 is connected to the light emitting signal line E, the first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When a light emitting signal of a turn-on level is applied to the light emitting signal line E, the fifth transistor T5 and the sixth transistor T6 cause the light emitting device to emit light by forming a driving current path between the first power supply line VDD and the second power supply line VSS.

A control electrode of the seventh transistor T7 is connected to the second scanning signal line S2, a first electrode of the seventh transistor T7 is connected to the initial signal line INIT, and a second electrode of the seventh transistor T7 is connected to the first electrode of the light emitting device. When a scanning signal of a turn-on level is applied to the second scanning signal line S2, the seventh transistor T7 transmits the initial voltage to the first electrode of the light emitting device to initialize or release the accumulated charges at the first electrode of the light emitting device.

In an exemplary embodiment, the light emitting device may be an OLED including a first electrode (anode), an organic light emitting layer, and a second electrode (cathode) stacked together, or may be a QLED including a first electrode (anode), a quantum dot light emitting layer, and a second electrode (cathode) stacked together.

In an exemplary embodiment, a second electrode of the light emitting device is connected to the second power supply line VSS. The signal of the second power supply line VSS is a low level signal, and the signal of the first power supply line VDD is a high level signal. The first scanning signal line S1 is a scanning signal line of the pixel driving circuits in the present display row, and the second scanning signal line S2 is a scanning signal line of the pixel driving circuits in the previous display row. That is, for an $n^{th}$ display row, the first scanning signal line S1 is S(n), the second scanning signal line S2 is S(n−1). The second scanning signal line S2 in the present display row and the first scanning signal line S1 of the pixel driving circuits in the previous display row are the same signal line, which can reduce the number of the signal lines of the display panel and realize the narrow bezel of the display panel.

In an exemplary embodiment, the first to seventh transistors T1 to T7 may be P-type transistors or may be N-type transistors. The same type of transistors are adopted in the pixel driving circuit, so that the process flow can be simplified, the process difficulty for manufacturing the display panel can be reduced, and the yield of product can be improved. In some possible implementations, the first to seventh transistors T1 to T7 may include P-type transistors and N-type transistors.

In exemplary embodiments, the first to seventh transistors T1 to T7 each may adopt a low temperature poly-silicon thin film transistor, or may adopt an oxide thin film transistor, or the first to seventh transistors T1 to T7 may adopt both a low temperature poly-silicon thin film transistor and an oxide thin film transistor. An active layer of the low temperature poly-silicon thin film transistor adopts low temperature poly-silicon (LTPS), and the active layer of the oxide thin film transistor adopts oxide semiconductor (Oxide). The low temperature poly-silicon thin film transistor has the advantages of high mobility, high charging speed and the like, and the oxide thin film transistor has the advantages of low leakage current and the like. The low temperature poly-silicon thin film transistor and the oxide thin film transistor may be integrated in one display substrate to form a low temperature polycrystalline oxide (LTPO) display substrate, the advantages of both the low temperature poly-silicon thin film transistor and the oxide thin film transistor can be utilized, low-frequency driving can be realized, power consumption can be reduced, and display quality can be improved.

An exemplary description will be given below through a manufacturing process of a display substrate. The term "patterning process" in the present disclosure, for a metal material, an inorganic material, or a transparent conductive material, includes processes of coating a photoresist, exposing with a mask plate, developing, etching, and stripping the photoresist, and for an organic material, includes processes of coating the organic material, exposing with a mask plate, and developing the organic material. A deposition process may adopt any one or more of sputtering, evaporation, and chemical vapor deposition, the coating process may adopt any one or more of spray coating, spin coating, and inkjet printing, and the etching process may adopt any one or more of dry etching and wet etching, which are not limited in the present disclosure. The term "film" is referred to as a layer of a material deposited, coated, or otherwise formed on a base substrate. A "film" may alternatively be referred to as a "layer" if it does not require a patterning process throughout the manufacturing procedure. If a "film" requires a patterning process during the entire manufacturing procedure, the "film" is referred to as a "film" before the patterning process, and referred to as a "layer" after the patterning process. The "layer" after the patterning process includes at least one "pattern". The term "A and B are in a same layer" in the present disclosure means that A and B are formed simultaneously by a same patterning process, and a "thickness" of the film or layer is a dimension of the film or layer in a direction perpendicular to the display substrate. In an exemplary embodiment of the present disclosure, the term "an orthographic projection of B is within an orthographic projection of A" or the term "an orthographic projection of A includes an orthographic projection of B" means that a boundary of the orthographic projection of B falls within a boundary of the orthographic projection of A, or the boundary of the orthographic projection of A overlaps the boundary of the orthographic projection of B.

In some examples, taking eight pixel driving circuits (in two unit rows and four unit columns) as an example, the manufacturing procedure of the driving circuit layer may include the following operations.

(1) Forming a pattern of a semiconductor layer. In some examples, the forming a pattern of a semiconductor layer may include: sequentially depositing a first insulating film and a semiconductor film on a base substrate, and patterning the semiconductor film through a patterning process, to form a first insulating layer covering the base substrate and a semiconductor layer arranged on the first insulating layer, as shown in FIG. 5.

In some examples, the semiconductor layer of each pixel driving circuit may include a first active layer 11 of the first transistor T1, a second active layer 12 of the second transistor T2, a third active layer 13 of the third transistor T3, a fourth active layer 14 of the fourth transistor T4, a fifth active layer 15 of the fifth transistor T5, a sixth active layer 16 of the sixth transistor T6, and a seventh active layer 17 of the seventh transistor T7, which are of an inter-connected one-piece structure. In each unit column, the sixth active layer 16 of the pixel driving circuit in an $M^{th}$ row and the seventh active layer 17 of the pixel driving circuit in an $(M+1)^{th}$ row are connected to each other. That is, the semiconductor layers of the adjacent pixel driving circuits in each unit column are of an inter-connected one-piece structure.

Figure 6A:
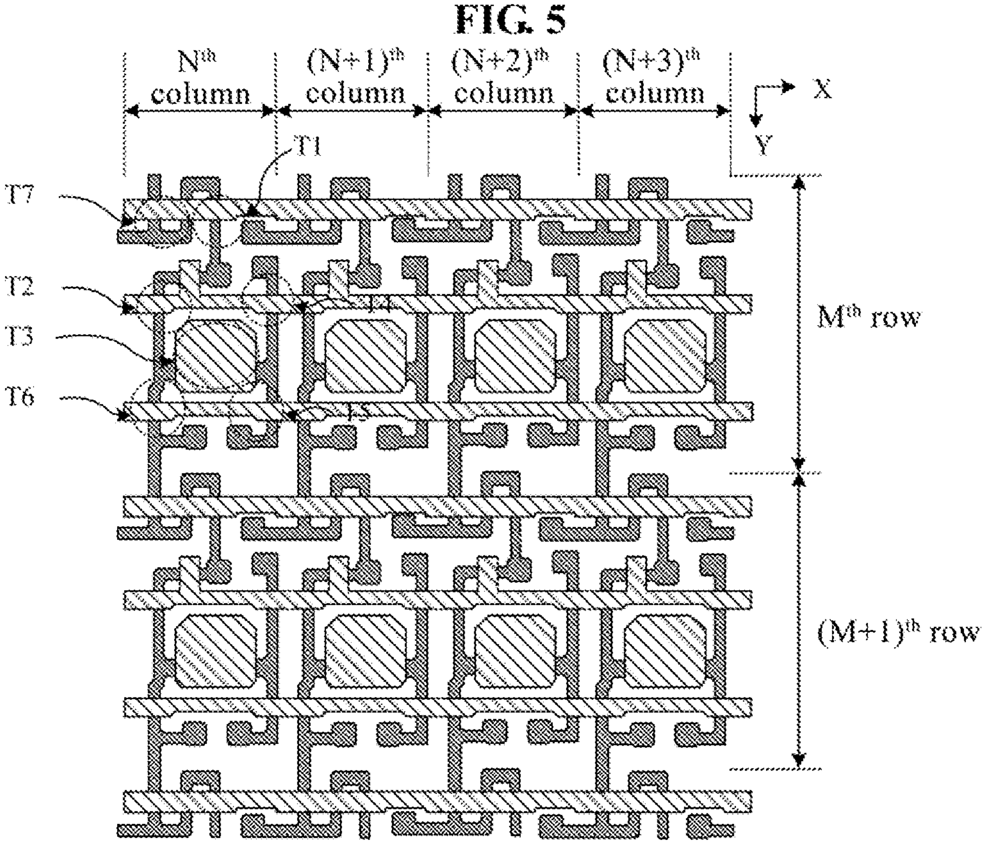
FIG. 6*a* is a schematic diagram of a display substrate after a pattern of a first conductive layer being formed according to the present disclosure.
Figure 6B:
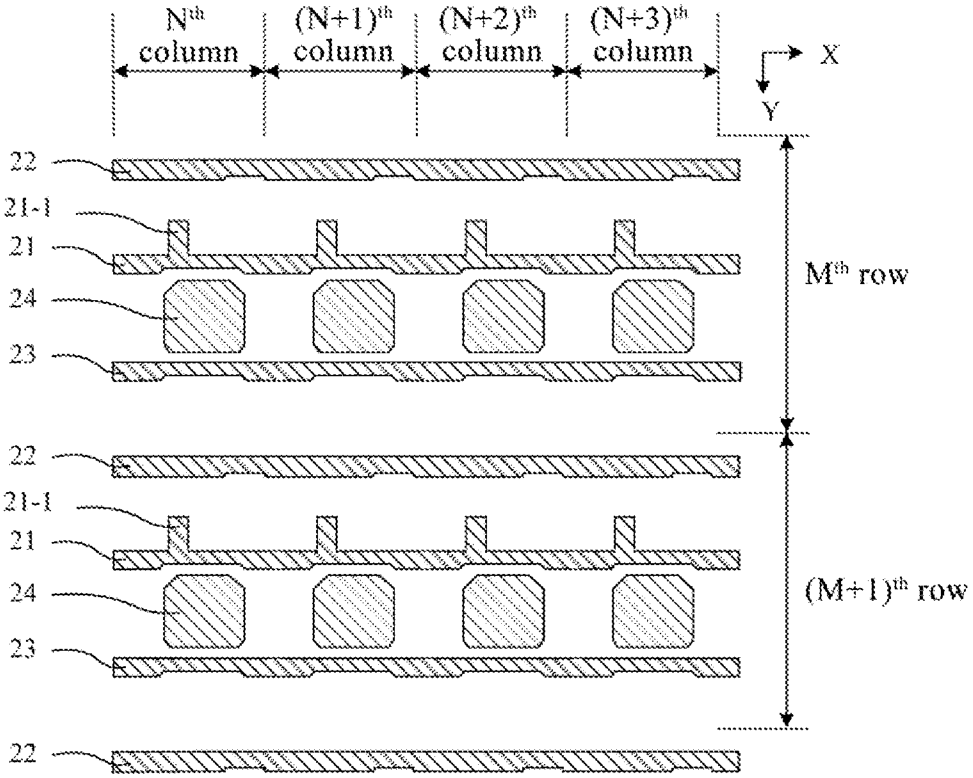
FIG. 6*b* is a schematic plan view of the first conductive layer in FIG. 6*a*.

(2) Forming a pattern of a first conductive layer. In some examples, the forming a pattern of a first conductive layer may include: sequentially depositing a second insulating film and a first conductive film on the base substrate with the above described pattern formed thereon, and patterning the first conductive film through a patterning process, to form a second insulating layer covering the pattern of the semiconductor layer and the pattern of the first conductive layer arranged on the second insulating layer. The pattern of the first conductive layer includes, as shown in FIGS. 6*a* and 6*b*, at least the first scanning signal line 21, the second scanning signal line 22, the light emitting control line 23, and a first plate 24. FIG. 6*b* is a schematic plan view of the first conductive layer in FIG. 6*a*.

Figure 5:
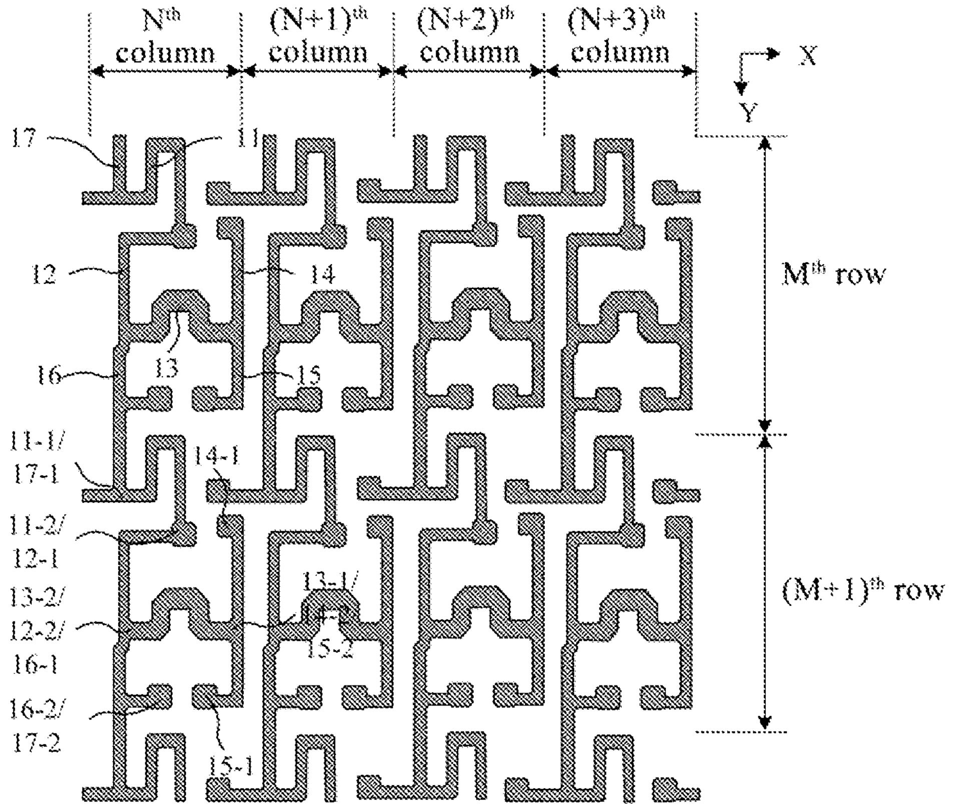
FIG. 5 is a schematic view of a display substrate after a pattern of a semiconductor layer being formed according to the present disclosure.

In conjunction with FIGS. 5 to 6*b*, main body portions of the first scanning signal line 21, the second scanning signal line 22, and the light emitting control line 23 may each extend in the first direction X. The first scanning signal line 21 and the second scanning signal line 22 of a pixel driving circuit in the $M^{th}$ row are located on a side of a first plate 24 of this pixel driving circuit away from a pixel driving circuit in the $(M+1)^{th}$ row, the second scanning signal line 22 is located on a side of the first scanning signal line 21 of this pixel driving circuit away from the first plate 24, and the light emitting control line 23 may be located on a side of the first plate 24 of this pixel driving circuit close to the pixel driving circuit in the $(M+1)^{th}$ row.

In some examples, the first plate 24 may have a rectangular shape, corners of the rectangular shape may be chamfered, and an overlapping region exists between an orthographic projection of the first plate 24 on the base substrate and an orthographic projection of the third active layer of the third transistor T3 on the base substrate. In an exemplary embodiment, the first plate 24 may serve as both one plate of the storage capacitor and the gate electrode of the third transistor T3.

In some examples, a region of the first scanning signal line 21 overlapping the second active layer 12 serves as a gate electrode of the second transistor T2. The first scanning signal line 21 is provided with a gate block 21-1 protruding toward the second scanning signal line 22, and an overlapping region exists between an orthographic projection of the gate block 21-1 on the base substrate and an orthographic projection of the second active layer 12 on the base substrate, thereby forming a double gate structure of the second transistor T2. A region of the first scanning signal line 21 overlapping the fourth active layer 14 serves as a gate electrode of the fourth transistor T4. A region of the second scanning signal line 22 overlapping the first active layer 11 serves as a gate electrode of the first transistor T1 with a dual gate structure. A region of the second scanning signal line 22 overlapping the seventh active layer 17 serves as a gate electrode of the seventh transistor T7. A region of the light emitting control line 23 overlapping the fifth active layer 15 serves as a gate electrode of the fifth transistor T5. A region of the light emitting control line 23 overlapping the sixth active layer 16 serves as a gate electrode of the sixth transistor T6.

In some examples, after the pattern of the first conductive layer is formed, a part of the semiconductor layer is treated to become a conductor with the first conductive layer as a mask. Channel regions of the first to seventh transistors T1 to T7 are formed by regions of the semiconductor layer masked by the first conductive layer, respectively, and regions of the semiconductor layer not masked by the first conductive layer each become a conductor. That is, both a first region and a second region of each of the first to seventh active layers each become a conductor.

Figure 7A:
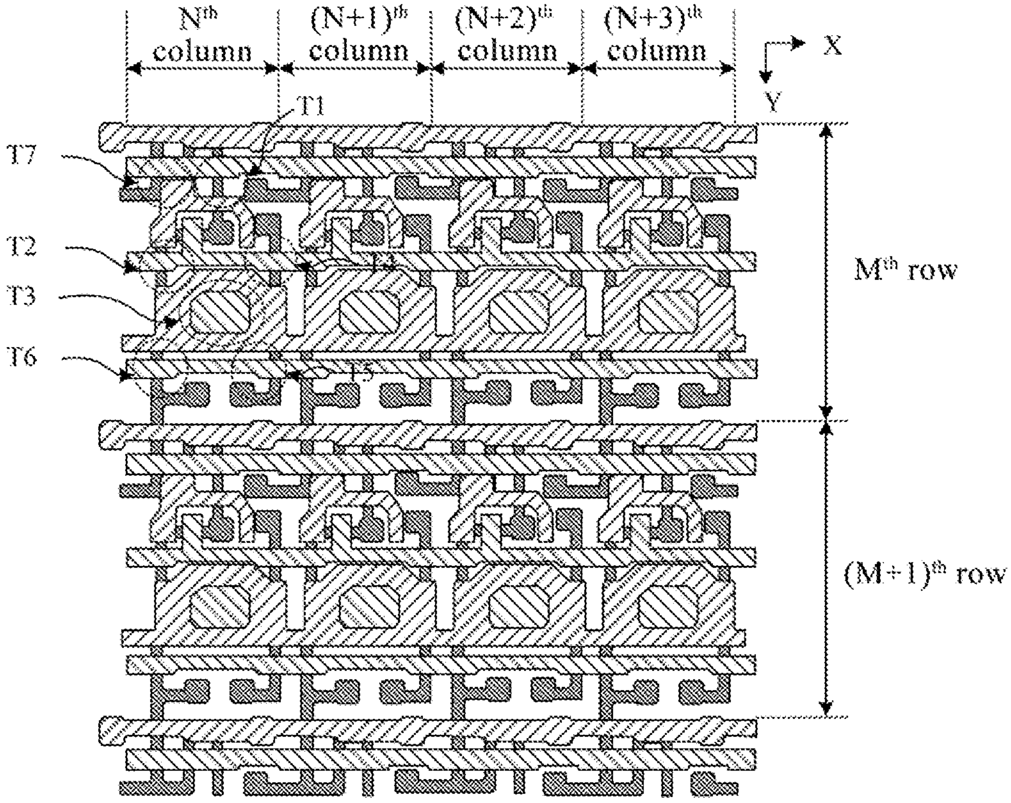
FIG. 7*a* is a schematic view of a display substrate after a pattern of a fourth conductive layer being formed according to the present disclosure.
Figure 7B:
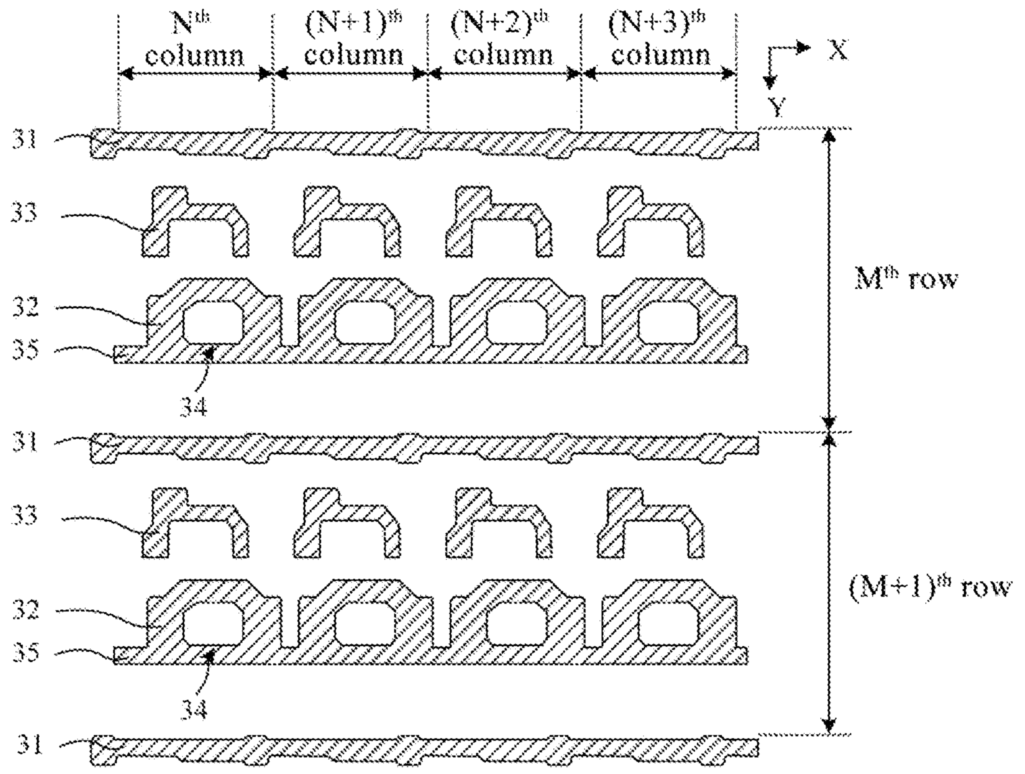
FIG. 7*b* is a schematic plan view of the fourth conductive layer in FIG. 7*a*.

(3) Forming a pattern of a fourth conductive layer. In an exemplary embodiment, the forming a pattern of the second conductive layer may include: sequentially depositing a third insulating film and a fourth conductive film on the base substrate with the above described patterns formed thereon, and patterning the fourth conductive film through a patterning process, to form a third insulating layer covering the first conductive layer and the pattern of the second conductive layer arranged on the third insulating layer. The pattern of the second conductive layer includes, as shown in FIGS. 7*a* and 7*b*, at least the first initial signal line 31, a second plate 32, a shielding electrode 33 and a plate connection line 35. FIG. 7*b* is a schematic plan view of the fourth conductive layer in FIG. 7*a*.

In conjunction with FIGS. 5 to 7*b*, a main body portion of the first initial signal line 31 may extend in the first direction X. The first initial signal line 31 of a pixel driving circuit in the $M^{th}$ row is located on a side of the second scanning signal line 22 of this pixel driving circuit away from a pixel driving circuits in the $(M+1)^{th}$ row. The second plate 32, as the other plate of the storage capacitor, is located between the first scanning signal line 21 and the light emitting control line 23 of this pixel driving circuit. The shielding electrode 33 is located between the second scanning signal line 22 and the first scanning signal line 21 (not including the main body portion of the gate block 21-1) of this pixel driving circuit. The shielding electrode 33 is configured to shield a key node from being affected by a data voltage jump, so as to avoid an influence of the data voltage jump on a potential of the key node of the pixel driving circuit, and improve the display effect.

In some examples, the second plate 32 may have a rectangular shape, corners of the rectangular shape may be chamfered. An overlapping region exists between an orthographic projection of the second plate 32 on the base substrate and an orthographic projection of the first plate 24 on the base substrate, and the first plate 24 and the second plate 32 form the storage capacitor of the pixel driving circuit. The second plate 32 has an opening 34, and the opening 34 may be located in the middle of the second plate 32. The opening 34 may be rectangular such that the second plate 32 forms a ring-shaped structure. The opening 34 exposes the third insulating layer covering the first plate 24, and the orthographic projection of the first plate 24 on the base substrate includes the orthographic projection of the opening 34 on the base substrate. In an exemplary embodiment, the opening 34 is configured to receive a subsequently formed first via, which is located within the opening 34 and exposes the first plate 24, to connect a subsequently formed second electrode of the first transistor T1 to the first plate 24.

In an exemplary embodiment, the plate connection line 35 is arranged between the second plates 32 of adjacent pixel driving circuits in the first direction X or in a direction opposite to the first direction X. A first end of the plate connection line 35 is connected to the second plate 32 of the pixel driving circuit, and a second end of the plate connection line 35 extends in the first direction X or in the direction opposite to the first direction X and is connected to the second plate 32 of the adjacent pixel driving circuit. That is, the plate connection line 35 is configured to connect the second plates of the adjacent pixel driving circuits in a unit row to each other. In an exemplary embodiment, the second plates of the plurality of pixel driving circuits in a unit row may form a inter-connected one-piece structure through the plate connection line 35, and the second plates of the one-piece structure may also serve as a power signal line, so as to ensure that the plurality of second plates in a unit row have a same potential, which is beneficial to improving the uniformity of the display panel, avoiding the display defects of the display substrate from occurring, and ensuring a good display effect of the display substrate.

Figure 8A:
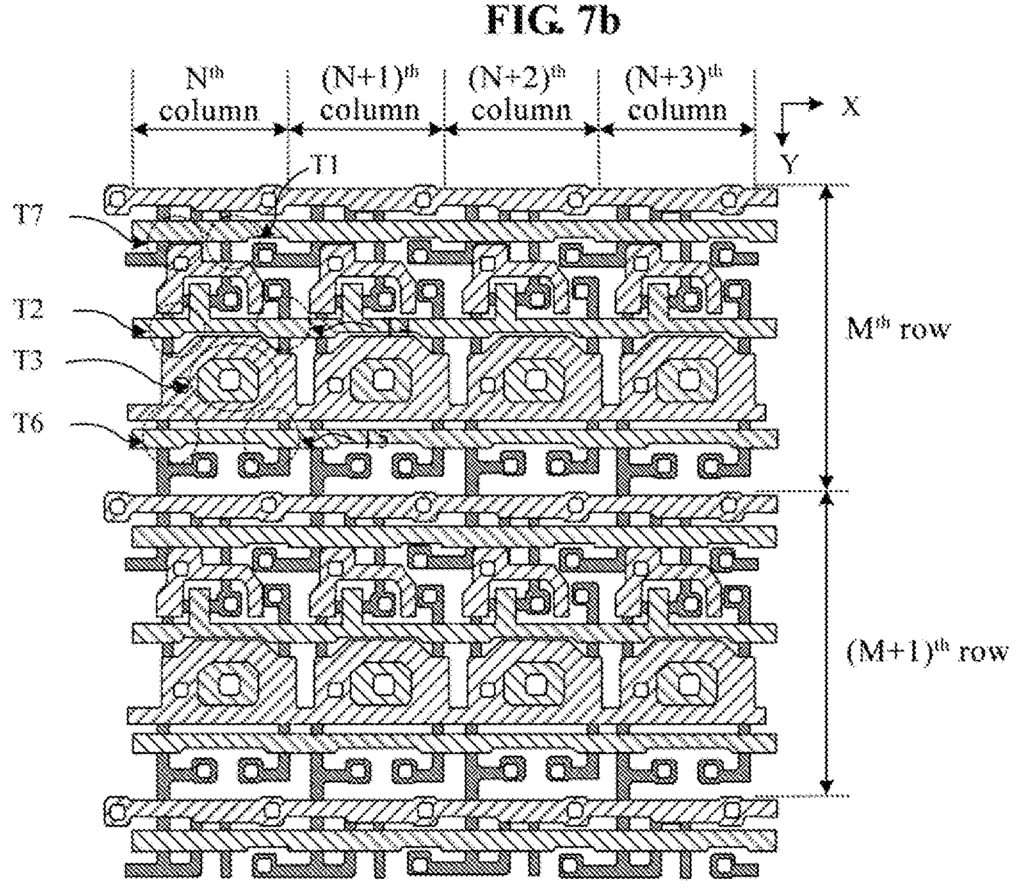
FIG. 8*a* is a schematic view of a display substrate after a pattern of a fourth insulating layer being formed according to the present disclosure.
Figure 8B:
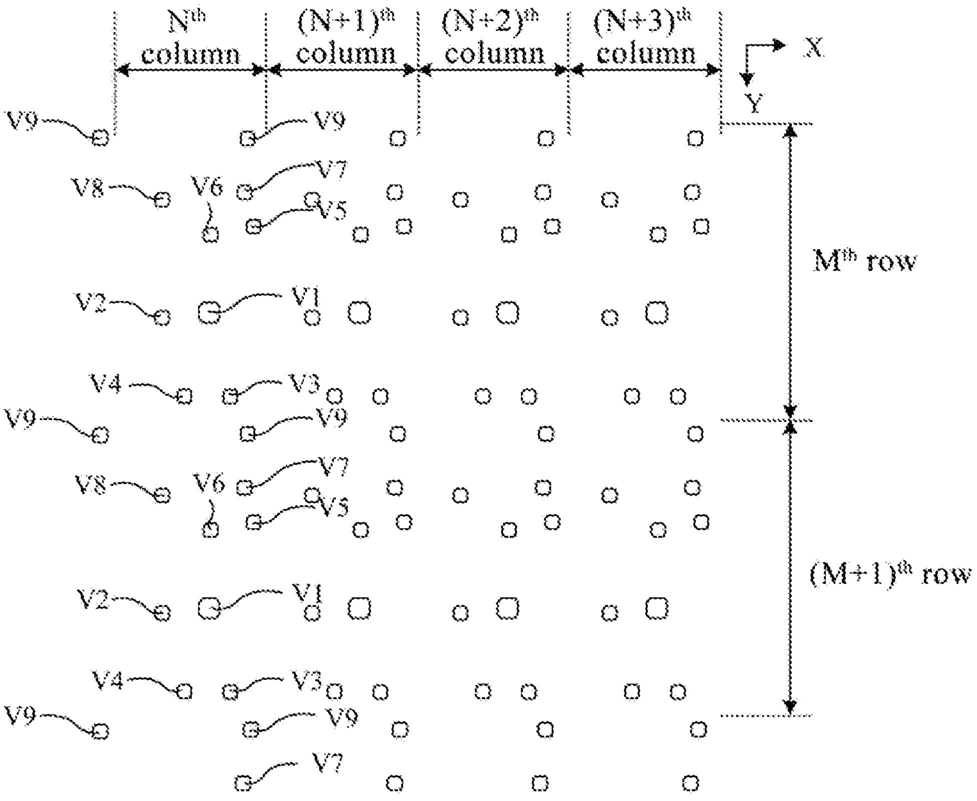
FIG. 8*b* is a schematic plan view of a plurality of vias in FIG. 8*a*.

(4) Forming a pattern of a fourth insulation layer. In an exemplary embodiment, the forming a pattern of a fourth insulation layer may include: depositing a fourth insulating film on the base substrate with the above described patterns formed thereon, and patterning the fourth insulating film through a patterning process, to form the fourth insulating layer covering the second conductive layer. Each pixel driving circuit is provided with a plurality of vias, and the plurality of vias include, as shown in FIGS. 8*a* and 8*b*, at least a first via V1, a second via V2, a third via V3, a fourth via V4, a fifth via V5, a sixth via V6, a seventh via V7, an eighth via V8, and a ninth via V9. FIG. 8*b* is a schematic plan view of the plurality of vias in FIG. 8*a*.

In conjunction with FIGS. 5 to 8*b*, the first via V1 is located in the opening 34 of the second plate 32, and an orthographic projection of the first via V1 on the base substrate is within the orthographic projection of the opening 34 on the base substrate. Parts of the fourth insulating layer and the third insulating layer in the first via V1 are etched away, exposing a surface of the first plate 24. The first via V1 is configured to connect the subsequently formed second electrode of the first transistor T1 to the first plate 24 through this via.

In some examples, an orthographic projection of the second via V2 on the base substrate is within the orthographic projection of the second plate 32 on the base substrate. A part of the fourth insulating layer in the second via V2 is etched away, exposing a surface of the second plate 32. The second via V2 is configured to connect a subsequently formed first power supply line to the second plate 32 through this via. In some examples, a plurality of second vias V2 as power vias may be provided, and the plurality of second vias V2 may be sequentially arranged along a second direction Y, to increase the connection reliability between the first power supply line and the second plate 32.

In some examples, an orthographic projection of the third via V3 on the base substrate is within an orthographic projection of the fifth active layer on the base substrate, and parts of the fourth insulating layer, the third insulating layer and the second insulating layer in the third via V3 are etched away, exposing a surface of a first region of the fifth active layer. The third via V3 is configured to connect a subsequently formed first power supply line to the fifth active layer through this via.

In some examples, an orthographic projection of the fourth via V4 on the base substrate is within an orthographic projection of the sixth active layer on the base substrate, and parts of the fourth insulating layer, the third insulating layer and the second insulating layer in the fourth via V4 are etched away, exposing a surface of a second region of the sixth active layer (also a second region of the seventh active layer). The fourth via V4 is configured to connect a subsequently formed second electrode of the sixth transistor T6 to the sixth active layer through this via, and to connect a subsequently formed second electrode of the seventh transistor T7 to the seventh active layer through this via.

In some examples, an orthographic projection of the fifth via V5 on the base substrate is within an orthographic projection of the fourth active layer on the base substrate, and parts of the fourth insulating layer, the third insulating layer and the second insulating layer in the fifth via V5 are etched away, exposing a surface of a first region of the fourth active layer. The fifth via V5 is configured to connect a subsequently formed data signal line to the fourth active layer through this via, and the fifth via V5 is referred to as a data writing hole.

In some examples, an orthographic projection of the sixth via V6 on the base substrate is within an orthographic projection of the second active layer on the base substrate, and parts of the fourth insulating layer, the third insulating layer and the second insulating layer in the sixth via V6 are etched away, exposing a surface of a first region of the second active layer (also a second region of the first active layer). The sixth via V6 is configured to connect the subsequently formed second electrode of the first transistor T1 to the first active layer through this via, and to connect the subsequently formed first electrode of the second transistor T2 to the second active layer through this via.

In some examples, an orthographic projection of the seventh via V7 on the base substrate is within an orthographic projection of the seventh active layer on the base substrate, and parts of the fourth insulating layer, the third insulating layer and the second insulating layer in the seventh via V7 are etched away, exposing a surface of a first region of the seventh active layer (also a first region of the first active layer). The seventh via V7 is configured to connect a subsequently formed first electrode of the seventh transistor T7 to the seventh active layer through this via, and to connect the subsequently formed first electrode of the first transistor T1 to the first active layer through this via.

In some examples, an orthographic projection of the eighth via V8 on the base substrate is within an orthographic projection of the shielding electrode 33 on the base substrate, and a part of the fourth insulating layer in the eighth via V8 is etched away, exposing a surface of the shielding electrode 33. The eighth via V8 is configured to connect the subsequently formed first power supply line with the shield electrode 33 through this via.

In some examples, an orthographic projection of the ninth via V9 on the base substrate is within an orthographic projection of the first initial signal line 31 on the base substrate, and a part of the fourth insulating layer in the ninth via V9 is etched away, exposing a surface of the first initial signal line 31. The ninth via V9 is configured to connect a subsequently formed first electrode of the seventh transistor T7 (also a first electrode of the first transistor T1) to the first initial signal line 31 through this via.

Figure 9A:
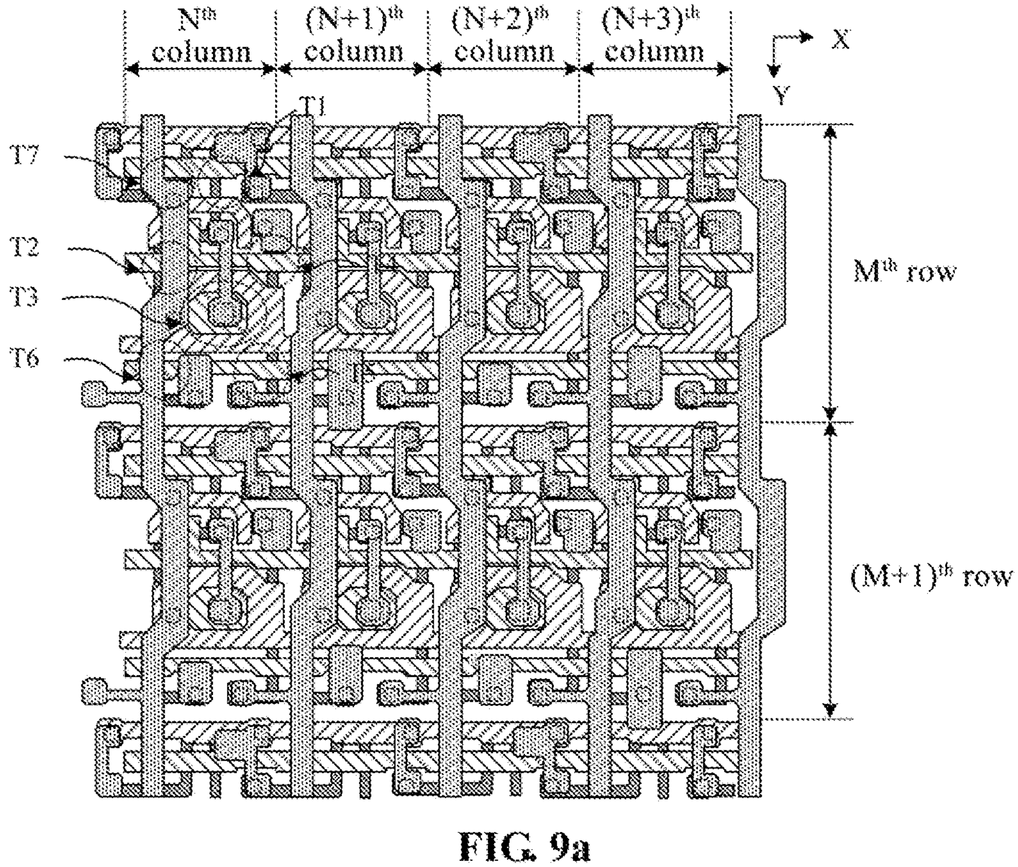
FIG. 9*a* is a schematic view of a display substrate after a pattern of a third conductive layer being formed according to the present disclosure.
Figure 9B:
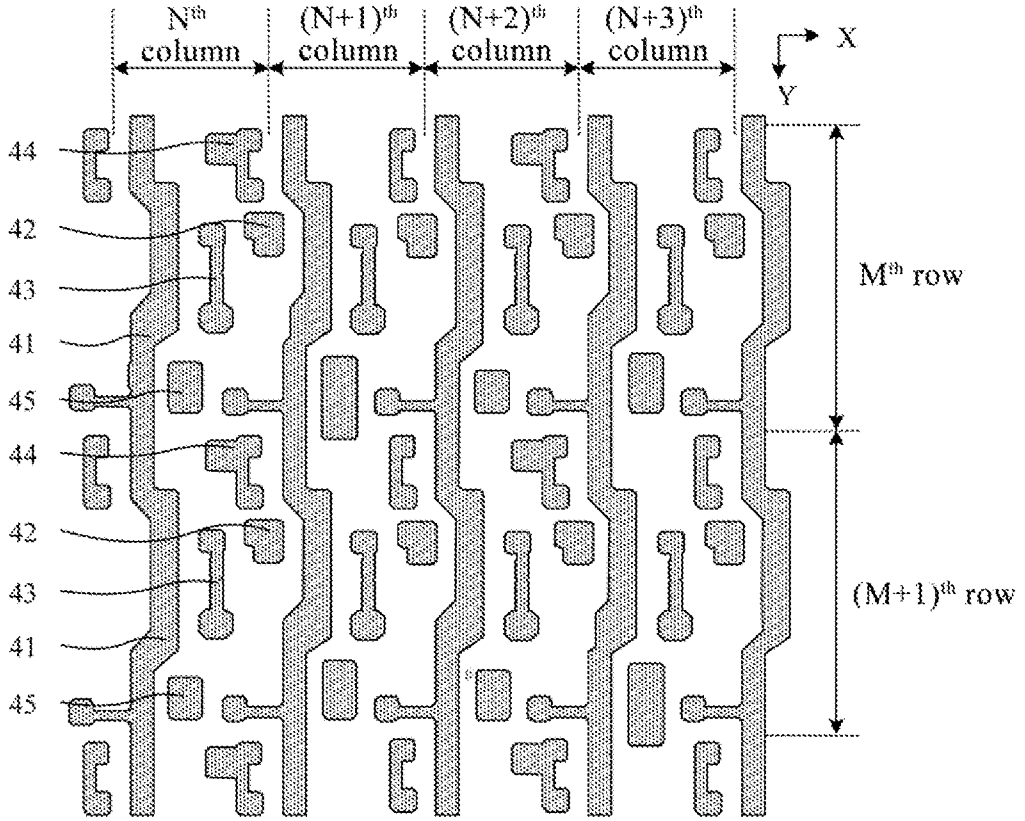
FIG. 9*b* is a schematic plan view of the third conductive layer in FIG. 9*a*.

(5) forming a pattern of a third conductive layer. In some examples, the forming a pattern of a third conductive layer may include: depositing a third conductive film on the base substrate with the above described patterns formed thereon, and patterning the third conductive film through a patterning process, to form a third conductive layer arranged on the fourth insulating layer. The third conductive layer includes, as shown in FIGS. 9*a* and 9*b*, at least a first power supply line 41, a data connection electrode 42, a first connection electrode 43, a second connection electrode 44, and a third connection electrode 45. FIG. 9*b* is a schematic plan view of the third conductive layer in FIG. 9*a*.

In conjunction with FIGS. 5 to 9*b*, a main body portion of the first power supply line 41 extends in the second direction Y. The first power supply line 41 is connected to the second electrode plate 32 through the second via V2 on the one hand, and is connected to the fifth active layer through the third via V3 on the other hand, and further is connected to the shielding electrode 33 through the eighth via V8, so that the shielding electrode 33 and the second electrode plate 32 have the same potential as the first power supply line 41. Since the shielding electrode 33 is connected to the first power supply line 41, and an orthographic projection of at least a part (e.g. a protrusion at the right side of the shielding electrode 33) of the shielding electrode 33 on the base substrate is located between an orthographic projection of the first connection electrode 43 (serving as the second electrode of the first transistor T1 and the first electrode of the second transistor T2, i.e. the second node N2) on the base substrate and an orthographic projection of a subsequently formed data signal line on the base substrate, the influence of the data voltage jump on the key node in the pixel driving circuit may be effectively shielded, the influence of the data voltage jump on the potential of the key node of the pixel driving circuit is avoided, and the display effect is improved.

In some examples, an orthographic projection of the at least a part of the shielding electrode 33 on the base substrate may at least partially overlap an orthographic projection of the subsequently formed data signal line on the base substrate. In an exemplary embodiment, the shielding electrodes 33 in the pixel driving circuits adjacent to each other in the first direction X may be connected to each other to reduce resistance.

In some examples, the data connection electrode 42 is connected to the first region of the fourth active layer through the fifth via V5, and the data connection electrode 42 is configured to be connected to the subsequently formed data signal line.

In some examples, the first connection electrode 43 extends in the second direction Y, a first end of the first connection electrode 43 is connected to the second region of the first active layer (also the first region of the second active layer) through the sixth via V6, and a second end of the first connection electrode 43 is connected to the first plate 24 through the first via V1, so that the first plate 24, the second electrode of the first transistor T1, and the first electrode of the second transistor T2 have the same potential. In an exemplary embodiment, the first connection electrode 43 may serve as the second electrode of the first transistor T1 and the first electrode of the second transistor T2.

In some examples, a first end of the second connection electrode 44 is connected to the first initial signal line 31 through the ninth via V9, and a second end of the second connection electrode 44 is connected to the first region of the seventh active layer (also the first region of the first active layer) through the seventh via V7, so that the first electrodes of the seventh transistor T7 and the first electrode of the first transistor T1 have the same potential as the first initial signal line 31.

In some examples, the third connection electrode 45 is connected to the second region of the sixth active layer (also the second region of the seventh active layer) through the fourth via V4, so that the second electrode of the sixth transistor T6 and the second electrode of the seventh transistor T7 have the same potential. In an exemplary embodiment, the third connection electrode 45 may serve as the second electrode of the sixth transistor T6 and the second electrode of the seventh transistor T7. In some examples, the third connection electrode 45 is configured to be connected to a subsequently formed anode connection electrode.

Figure 10A:
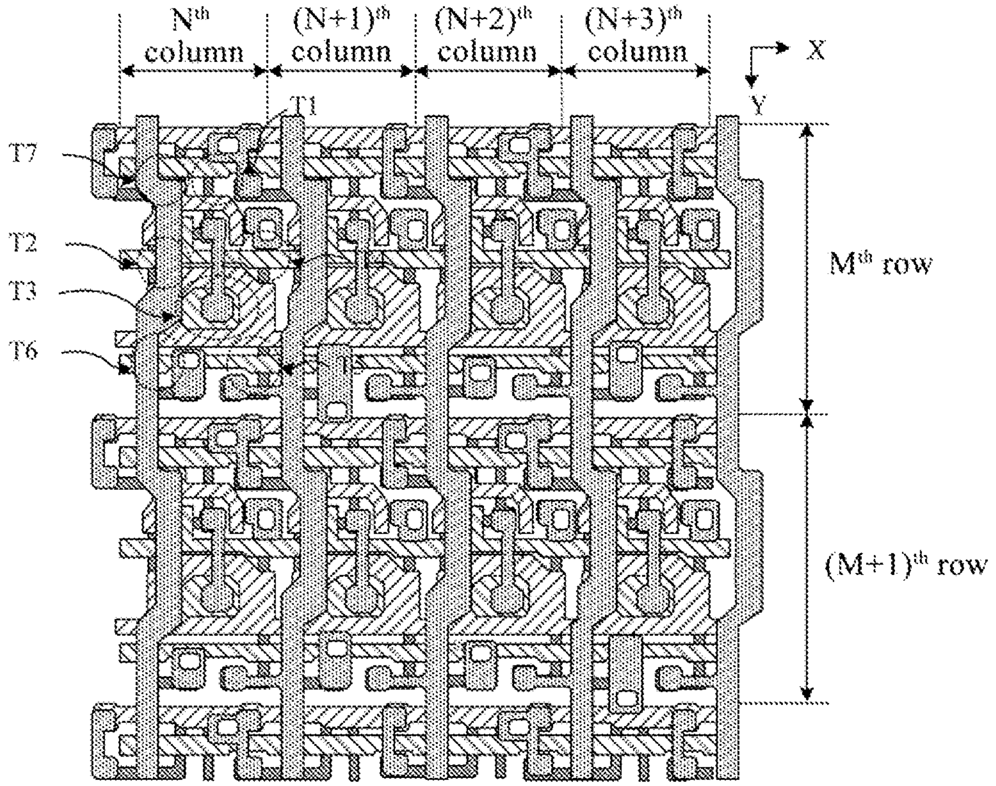
FIG. 10*a* is a schematic view of a display substrate after a pattern of a first planarization layer being formed according to the present disclosure.
Figure 10B:
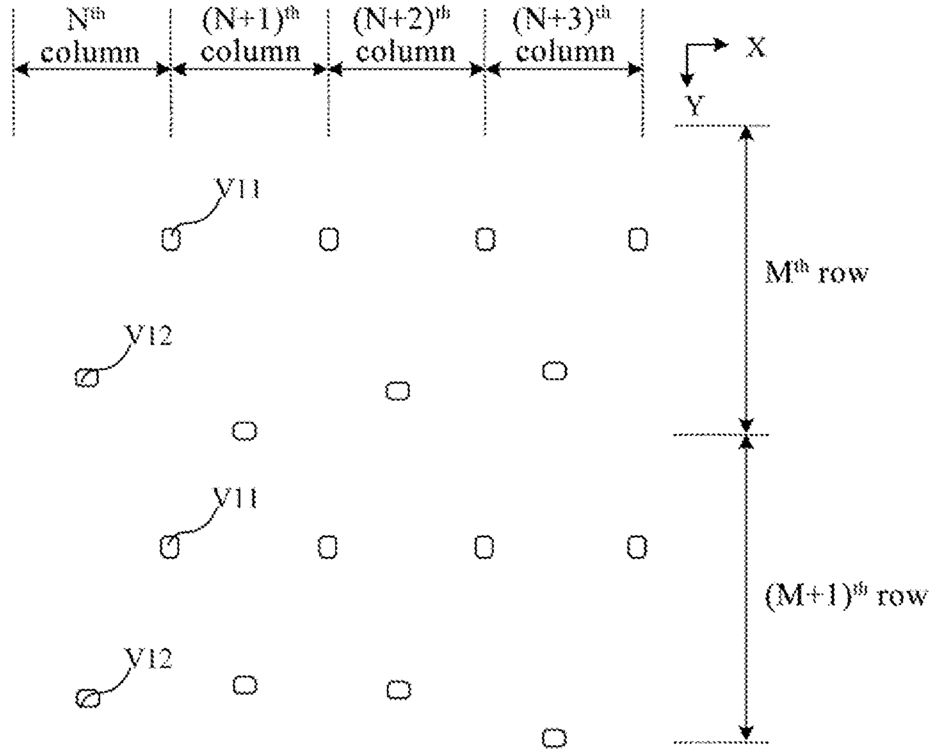
FIG. 10*b* is a schematic plan view of a plurality of vias in FIG. 10*a*.

(6) Forming a pattern of a first planarization layer. In an exemplary embodiment, the forming a pattern of a first planarization layer may include: coating a first planarization film on the base substrate with the above described patterns formed thereon, and patterning the first planarization film by a patterning process, to form the first planarization layer covering the third conductive layer. As shown in FIGS. 10*a* and 10*b*, an eleventh via V11 and a twelfth via V12 are arranged in the first planarization layer. FIG. 10*b* is a schematic plan view of a plurality of vias in FIG. 10*a*.

In conjunction with FIGS. 5 to 10*b*, an orthographic projection of the eleventh via V11 on the base substrate is within an orthographic projection of the data connection electrode 42 on the base substrate, and a part of the first planarization layer in the eleventh via V11 is removed, exposing a surface of the data connection electrode 42. The eleventh via V11 is configured to connect a subsequently formed data signal line to the data connection electrode 42 through this via.

In some examples, the eleventh via V11 may be in a strip shape, and an extension length of the eleventh via V11 in the second direction Y is greater than an extension length thereof in the first direction X. According to the present disclosure, by providing the eleventh via V11 in the strip shape extending in the second direction Y, a width of the eleventh via V11 in the first direction X may be reduced, and an inclination degree of a subsequently formed anode may be reduced.

An orthographic projection of the twelfth via V12 on the base substrate is within an orthographic projection of the third connection electrode 45 on the base substrate, and a part of the first planarization layer in the twelfth via V12 is removed, exposing a surface of the third connection electrode 45. The twelfth via V12 is configured to connect the subsequently formed anode connection electrode to the third connection electrode 45 through this via.

Figure 11A:
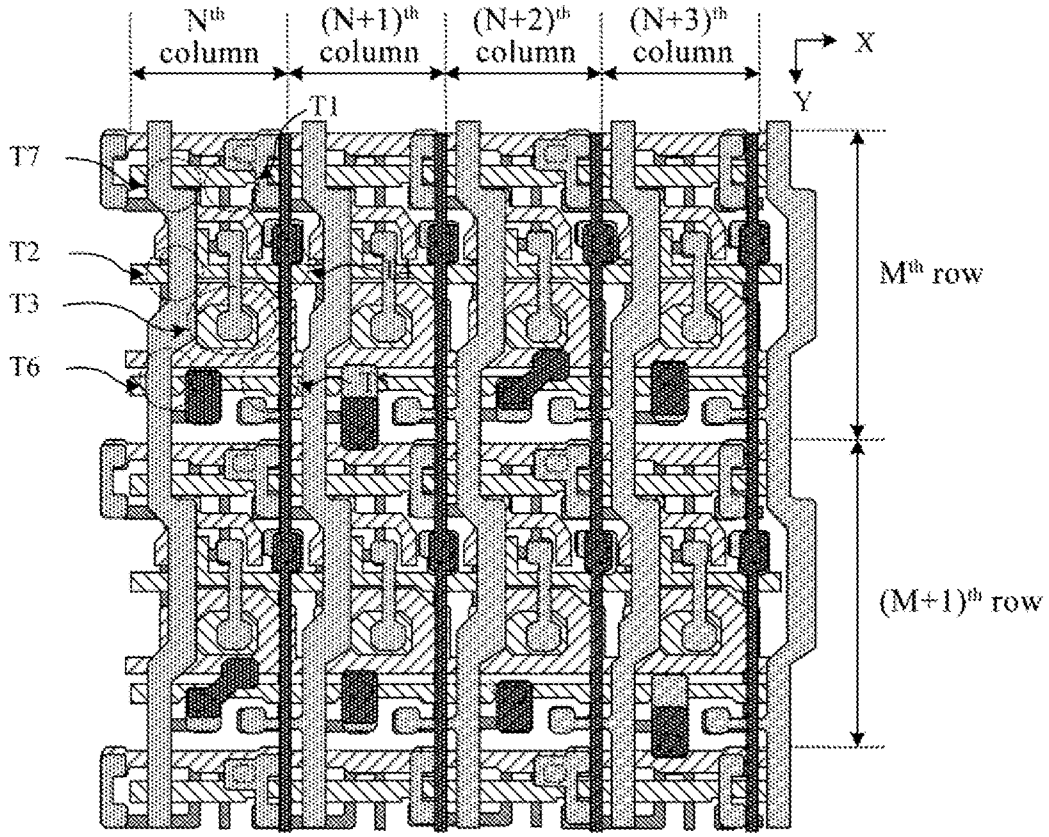
FIG. 11*a* is a schematic diagram of a display substrate after a pattern of a second conductive layer being formed according to the present disclosure.
Figure 11B:
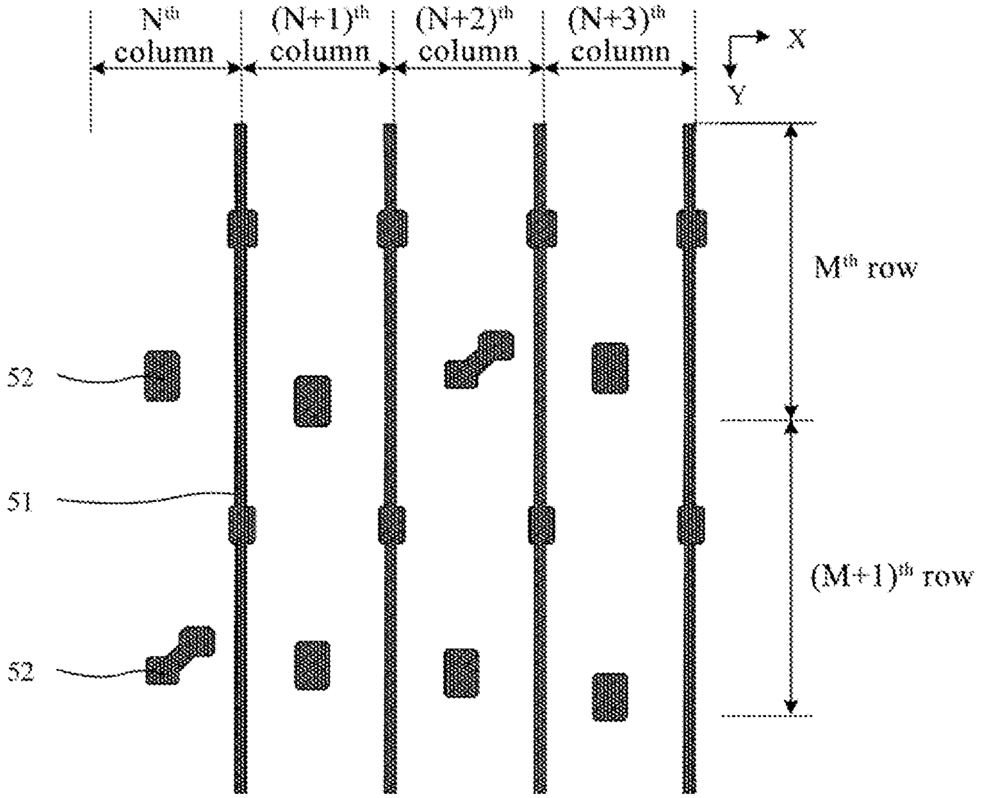
FIG. 11*b* is a schematic plan view of the second conductive layer in FIG. 11*a*.

(7) Forming a pattern of a second conductive layer. In an exemplary embodiment, the forming a pattern of a second conductive layer may include: depositing a second conductive film on the base substrate with the above described patterns formed thereon, and patterning the second conductive film through a patterning process, to form the fourth conductive layer arranged on the first planarization layer. The fourth conductive layer includes, as shown in FIGS. 11*a* and 11*b*, at least a data signal line 51 and an anode connection electrode 52. FIG. 11*b* is a schematic plan view of the fourth conductive layer in FIG. 11*a*.

In conjunction with FIGS. 5 to 11*b*, the data signal line 51 is provided in each unit column. The data signal line 51 may extend in the second direction Y, and the data signal line 51 is connected to the data connection electrode 42 through the eleventh via V11. Since the data connection electrode 42 is connected to the first region of the fourth active layer through the fifth via V5, it is achieved that the data signal line 51 is connected to the first region of the fourth active layer through the data connection electrode 42, to write the data signal into the fourth transistor T4.

In some examples, the anode connection electrode 52 is provided in at least a part of the pixel driving circuits. The anode connection electrode 52 is connected to the third connection electrode 45 through the twelfth via V12. Since the third connection electrode 45 is connected to the second region of the sixth active layer (also the second region of the seventh active layer) through the fourth via V4, it is achieved that the anode connection electrode 53 is connected to the second region of the sixth active layer (also the second region of the seventh active layer) through the third connection electrode 45.

Figure 12A:
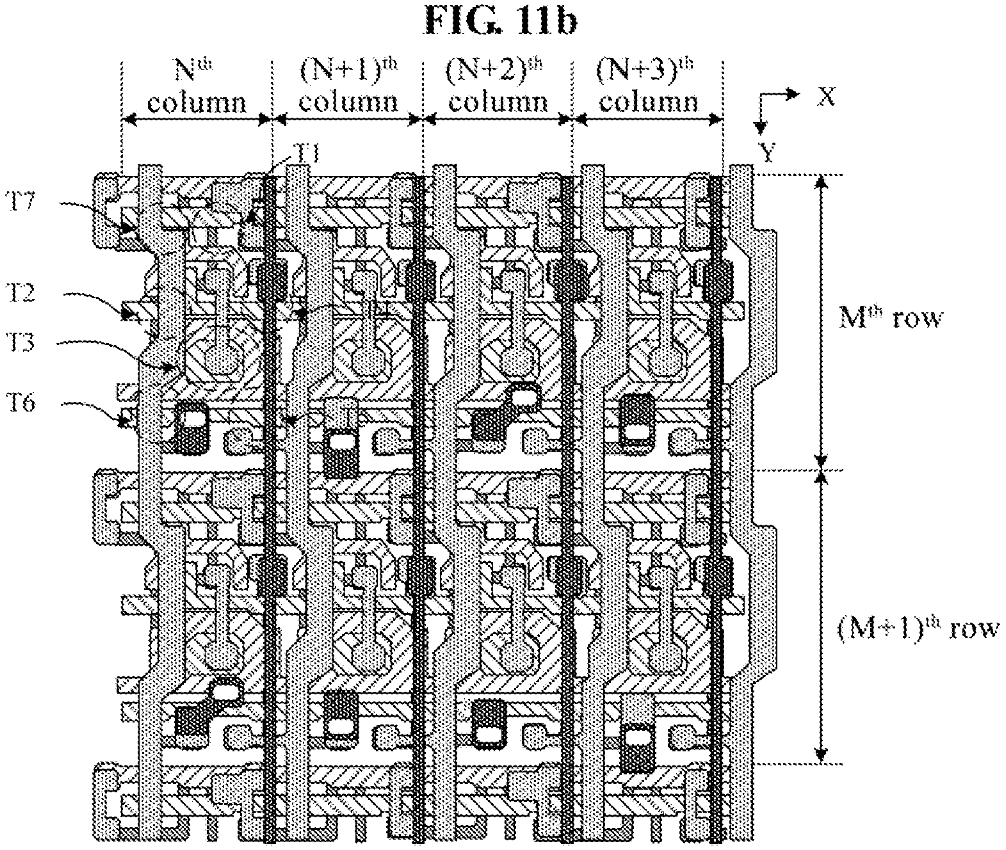
FIG. 12*a* is a schematic view of the display substrate after a pattern of a second planarization layer being formed according to the present disclosure.
Figure 12B:
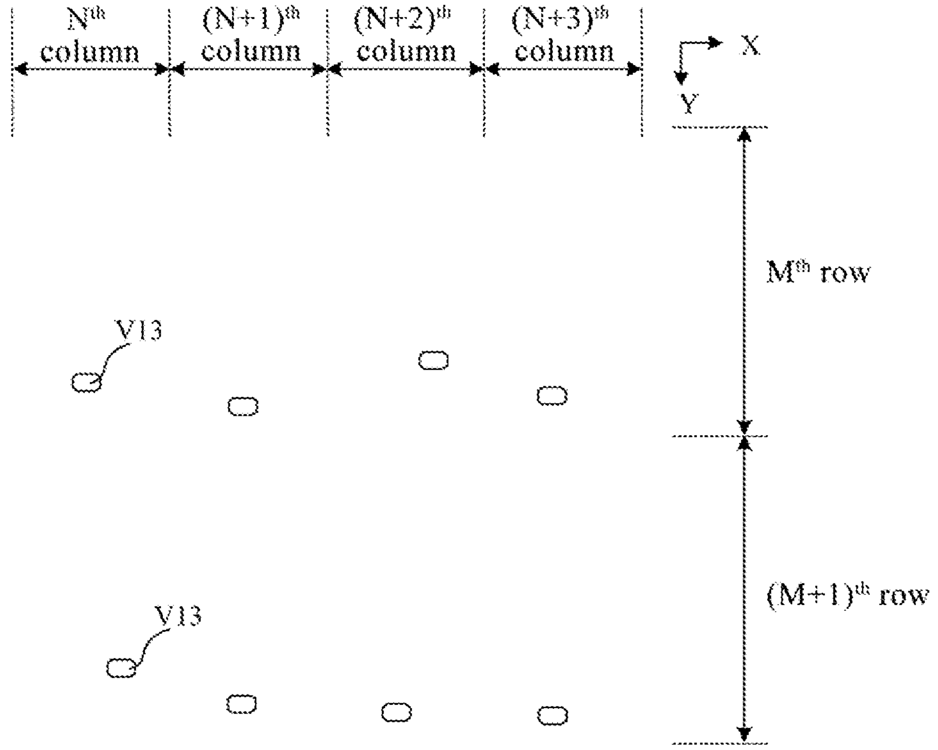
FIG. 12*b* is a schematic plan view of a plurality of vias in FIG. 12*a*.

(8) Forming a pattern of a second planarization layer. In an exemplary embodiment, the forming a pattern of a second planarization layer may include: coating a second planarization film on the base substrate with the above described patterns formed thereon, and patterning the second planarization film through a patterning process, to form the second planarization layer covering the fourth conductive layer. As shown in FIGS. 12*a* and 12*b*, a thirteenth via V13 is formed in the second planarization layer. FIG. 12*b* is a schematic plan view of a plurality of vias in FIG. 12*a*.

In conjunction with FIGS. 5 to 12*b*, an orthographic projection of the thirteenth via V13 on the base substrate is within an orthographic projection of the anode connection electrode 53 on the base substrate, and a part of the second planarization layer in the thirteenth via V13 is removed, exposing a surface of the anode connection electrode 52. The thirteenth via V13 is configured to connect a subsequently formed anode to the anode connection electrode 52 through this via.

To this end, the driving circuit layer is formed on the base substrate. The driving circuit layer may include a plurality of pixel driving circuits in a plane parallel to the display substrate, and each of the plurality of pixel driving circuits may include a pixel driving circuit, and a first scanning signal line, a second scanning signal line, a light emitting control line, a data signal line, a first power supply line, and a first initial signal line, which are connected to the pixel driving circuit. The driving circuit layer may include, in a plane perpendicular to the display substrate, a first insulating layer, a semiconductor layer, a second insulating layer, a first conductive layer, a third insulating layer, a second conductive layer, a fourth insulating layer, a third conductive layer, a first planarization layer, a fourth conductive layer, and a second planarization layer, which are sequentially stacked on the base substrate.

Figure 13A:
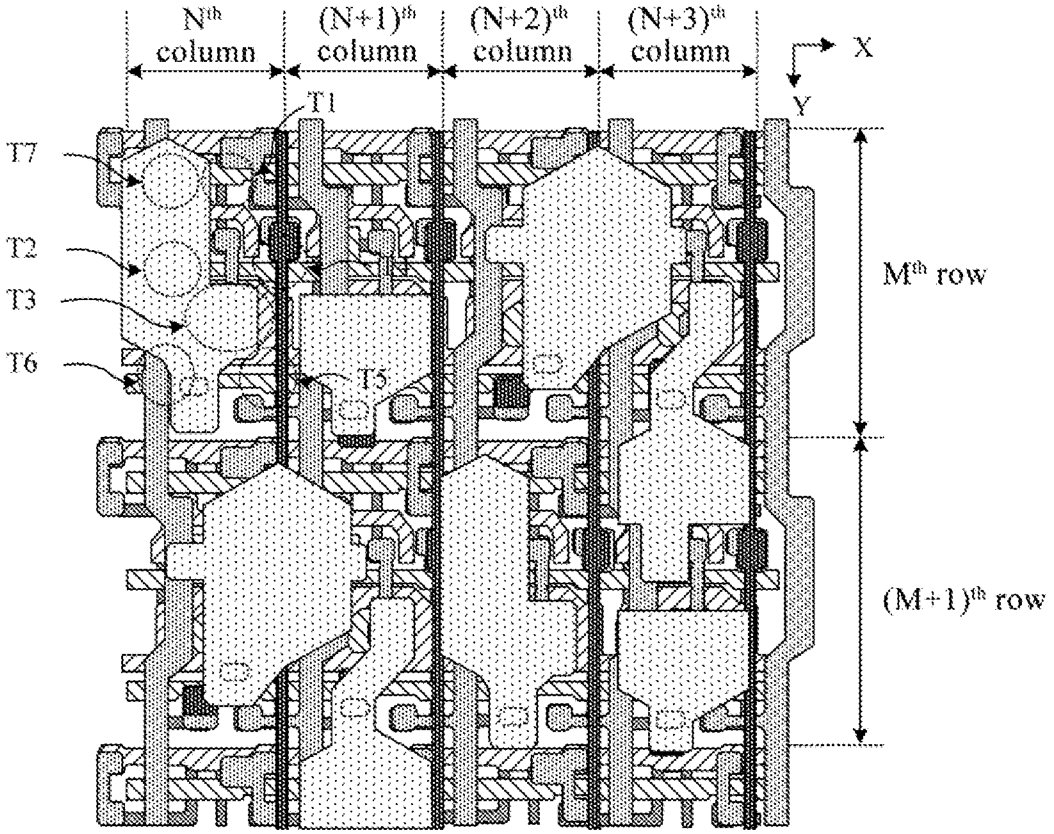
FIG. 13*a* is a schematic diagram of a display substrate after a pattern of anodes being formed according to the present disclosure.
Figure 13B:
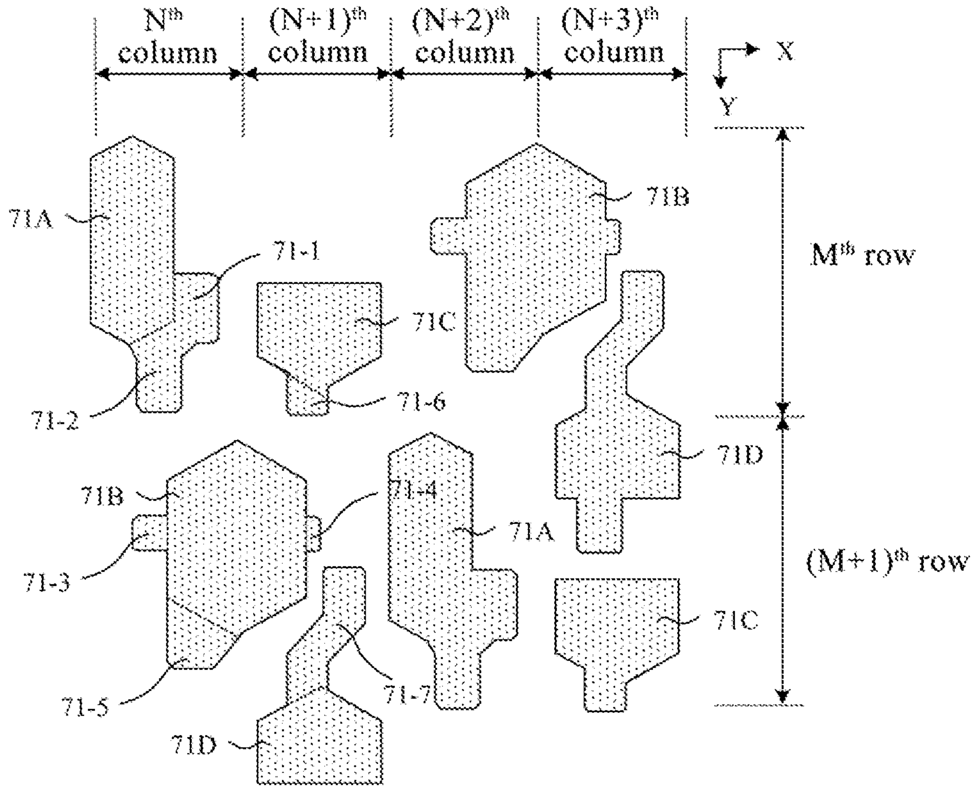
FIG. 13*b* is a schematic plan view of the anodes in FIG. 13*a*.

(9) forming a pattern of anodes. In some examples, the forming a pattern of anodes may include: depositing a fifth conductive film on the base substrate with the above described patterns formed thereon, and patterning the fifth conductive film through a patterning process, to form the pattern of anodes arranged on the second planarization layer. As shown in FIGS. 13*a* and 13*b*, the anodes form a GGRB pixel arrangement. FIG. 13*b* is a schematic plan view of the anodes in FIG. 13*a*.

In conjunction with FIGS. 5 to 13B, the pattern of anodes may include a first anode 71A of a red light emitting device, a second anode 71B of a blue light emitting device, a third anode 71C of a first green light emitting device, and a fourth anode 71D of a second green light emitting device. A region, where the first anode 71A is located, may form a red sub-pixel R emitting red light. A region, where the second anode 71B is located, may form a blue sub-pixel B emitting blue light. A region, where the third anode 71C is located, may form a first green sub-pixel G1 emitting green light. A region, where the fourth anode 71D is located, may form a second green sub-pixel G2 emitting green light. The red sub-pixel R and the blue sub-pixel B are sequentially arranged along the second direction Y, and the first green sub-pixel G1 and the second green sub-pixel G2 are sequentially arranged along the second direction Y. The first green sub-pixel G1 and the second green sub-pixel G2 are arranged on a side of the red sub-pixel R and the first blue sub-pixel B in the first direction X, respectively. The red sub-pixel R, the blue sub-pixel B, the first green sub-pixel G1, and the second green sub-pixel G2 constitute one pixel unit.

In some examples, in one pixel unit, the first anode 71A is connected to the anode connection electrode 52 in the pixel driving circuit in the $M^{th}$ row and $N^{th}$ column through the thirteenth via V13 in this pixel driving circuit, the second anode 71B is connected to the anode connection electrode 52 in the pixel driving circuit in the $(M+1)^{th}$ row and $N^{th}$ column through the thirteenth via V13 in this pixel driving circuit, the third anode 71C is connected to the anode connection electrode 52 in the pixel driving circuit in the $M^{th}$ row and $(N+1)^{th}$ column through the thirteenth via V13 in this pixel driving circuit, and the fourth anode 71D is connected to the anode connection electrode 52 in the pixel driving circuit in the $(M+1)^{th}$ row and $(N+1)^{th}$ column through the thirteenth via V13 in this pixel driving circuit. In another pixel unit, the first anode 71A is connected to the anode connection electrode 52 in the pixel driving circuit in the $(M+1)^{th}$ row and $(N+2)^{th}$ column through the thirteenth via V13 in this pixel driving circuit, the second anode 71B is connected to the anode connection electrode 52 in the pixel driving circuit in the $M^{th}$ row and $(N+2)^{th}$ column through the fourteenth via V14 in this pixel driving circuit, the third anode 71C is connected to the anode connection electrode 52 in the pixel driving circuit in the $(M+1)^{th}$ row and $(N+3)^{th}$ column through the thirteenth via V13 in this pixel driving circuit, and the fourth anode 71D is connected to the anode connection electrode 53 in the pixel driving circuit in the $M^{th}$ row and $(N+3)^{th}$ column through the thirteenth via V13 in this pixel driving circuit.

After the pattern of anodes of the light emitting devices is formed, the manufacturing procedure further includes forming structures such as a pixel defining layer, a light emitting layer and an encapsulation layer, so as to form a plurality of light emitting devices of a light emitting structure layer. Conventional process steps may be adopted for forming the light emitting device, and therefore, the description thereof will not be repeated.

In some examples, the base substrate may be a flexible base substrate, or may be a rigid base substrate. The rigid base substrate may be, but is not limited to, one or more of glass, quartz, and the flexible base substrate may be, but is not limited to, one or more of polyethylene terephthalate, ethylene terephthalate, polyetheretherketone, polystyrene, polycarbonate, polyarylate, polyimide, polyvinyl chloride, polyethylene, and textile fiber. In an exemplary embodiment, the flexible base substrate may include a first flexible material layer, a first inorganic material layer, a semiconductor layer, a second flexible material layer, and a second inorganic material layer, which are stacked together. The first flexible material layer and the second flexible material layer may be made of Polyimide (PI), polyethylene terephthalate (PET), or a surface-treated polymer film. The first inorganic material layer and the second inorganic material layer may be made of silicon nitride (SiNx), silicon oxide (SiOx), or the like, for improving water-oxygen resistance of the base substrate. The semiconductor layer may be made of amorphous silicon (a-si).

In some examples, the first, second, third, and fourth conductive layers may each be made of a metal material, such as any one or more of silver (Ag), copper (Cu), aluminum (Al), and molybdenum (Mo), or an alloy material of the above metals, such as aluminum neodymium alloy (AlNd) or molybdenum niobium alloy (MoNb), and may each have a single-layer structure or a multi-layer composite structure, such as Mo/Cu/Mo, or the like. The first, second, third, and fourth insulating layers may each be made of any one or more of silicon oxide (SiOx), silicon nitride (SiNx), and silicon oxynitride (SiON), and may each be of a single layer, a multilayer, or a composite layer. The first insulating layer is referred to as a buffer layer for improving water-oxygen resistance of the base substrate. The second and third insulating layers each are referred to as a gate insulating (GI) layer, and the fourth insulating layer is referred to as an interlayer insulating (ILD) layer. The active layer may be made of amorphous indium gallium zinc oxide (a-IGZO), zinc oxynitride (ZnON), Indium Zinc Tin oxide (IZTO), amorphous silicon (a-Si), poly-silicon (p-Si), hexathiophene, polythiophene, or the like. That is, the present disclosure is applicable to a transistor manufactured based on an oxide technology, a silicon technology, or an organic technology. The first and second planarization layers may be made of an organic material such as resin or the like.

As described above, it can be seen that the signal lines in the display substrate include the first scanning signal line, the second scanning signal line, the light emitting control line, and the first initial signal line, which each have the main body portion extending in the first direction, and the data line and the first power supply line, which each have the main body portion extending in the second direction. Where a blank region is reserved in the display region of the display substrate to form the functional element, these signal lines must be designed as winding or breaking so as to provide signals to the pixel driving circuit in the display substrate. In an embodiment of the present disclosure, a display substrate having a functional region in a display region is provided, which is similar to the above described display substrate and also includes the above described films, where the signal lines may include at least one of the above described first scanning signal line, second scanning signal line, light emitting control line, first initial signal line, data line, and first power supply line. The display substrate according to an embodiment of the present disclosure will be described in detail below.

In a first aspect, an embodiment of the present disclosure provides a display substrate having a display region, where the display region includes a functional region and a main display region. The functional region is provided with at least one functional unit, and each functional unit has a blank region, a winding region, and a circuit region. The winding region surrounds at least a part of the blank region, and other region except the blank region and the winding region in the functional unit is the circuit region. The display substrate includes a base substrate, and a plurality of conductive layers arranged on the base substrate, for example, including the first to fifth conductive layers described above. The plurality of conductive layers in the embodiment of the disclosure, form at least one hollow pattern, and the hollow pattern is arranged in the blank region. The plurality of conductive layers include a first signal line, and the first signal line includes a first line segment located in the main display region, a second line segment located in the circuit region and a third line segment located in the winding region. Extending directions of the first line segment and the second line segment are the same, the third line segment electrically connects the first line segment and the second line segment together, and the third line segment includes at least two line sub-segments with different extending directions.

For example, the display substrate includes a first type signal line having a main body portion extending in a first direction, and the first type signal lines include, but are not limited to, the first scanning signal line, the second scanning signal line, the light emitting control line, and the first initial signal line described above. The first type signal lines include a first sub-type signal line and a second sub-type signal line. The first sub-type signal line includes only a portion located in the main display region, and the second sub-type signal line includes not only a portion located in the main display region but also a portion located in the functional region. The second sub-signal line may be the above described first signal line. For convenience of understanding, taking the first type signal line being the second scanning signal line as an example, the second scanning signal line located in both the main display region and the functional region is the first signal line. Both of the first line segment and the second line segment of the first signal line extend in the first direction, and the third line segment of the first signal line includes not only a line sub-segment extending in the first direction but also a line sub-segment extending in the second direction. Similarly, the first scanning signal line, the light emitting control line, and the first initial signal line located in both the main display region and the functional region also may be arranged in the manner of arranging the second scanning signal line located in both the main display region and the functional region.

For another example, the display substrate includes a second type signal lines having a main body portion extending in the second direction, and the second type signal lines include, but are not limited to, the data line and the first power supply line. The second type signal lines include a third sub-type signal line and a fourth type signal line. The third sub-type signal line includes only a portion located in the main display region, and the fourth sub-type signal line includes not only a portion located in the main display region but also a portion located in the functional region. The fourth sub-type signal line may be the first signal line. For convenience of understanding, taking the second type signal line being the data line as an example, the data line located in both the main display region and the functional region is the first signal line. Both of the first line segment and the second line segment of the first signal line extend in the second direction, and the third line segment of the first signal line includes not only a line sub-segment extending in the first direction but also a line sub-segment extending in the second direction. Similarly, the first power supply line located in both the main display region and the functional region also may be arranged in the manner of arranging the data lines located in both the display region and the functional region.

In order to make the structure of the first signal line in the embodiment of the present disclosure clearer, the following description is made with reference to specific examples. For convenience of understanding, in the following description, it is taken as an example that the first signal lines are the second scanning signal line located in both the main display region and the functional region (such first signal line is hereinafter simply referred to as the second scanning signal line), and data line located in both the main display region and the functional region (such first signal line is hereinafter simply referred to as the data line), respectively.

Figure 14A:
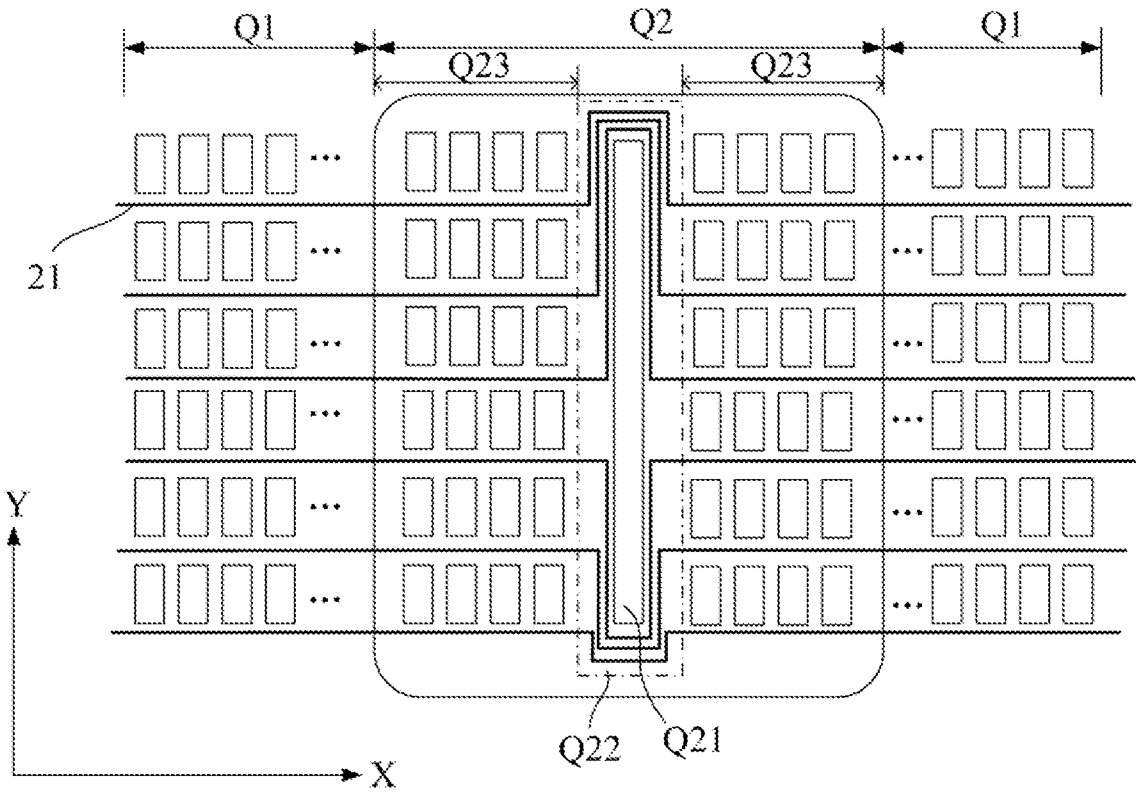
FIG. 14*a* is a schematic view of a part of a display substrate according to an embodiment of the disclosure.
Figure 14B:
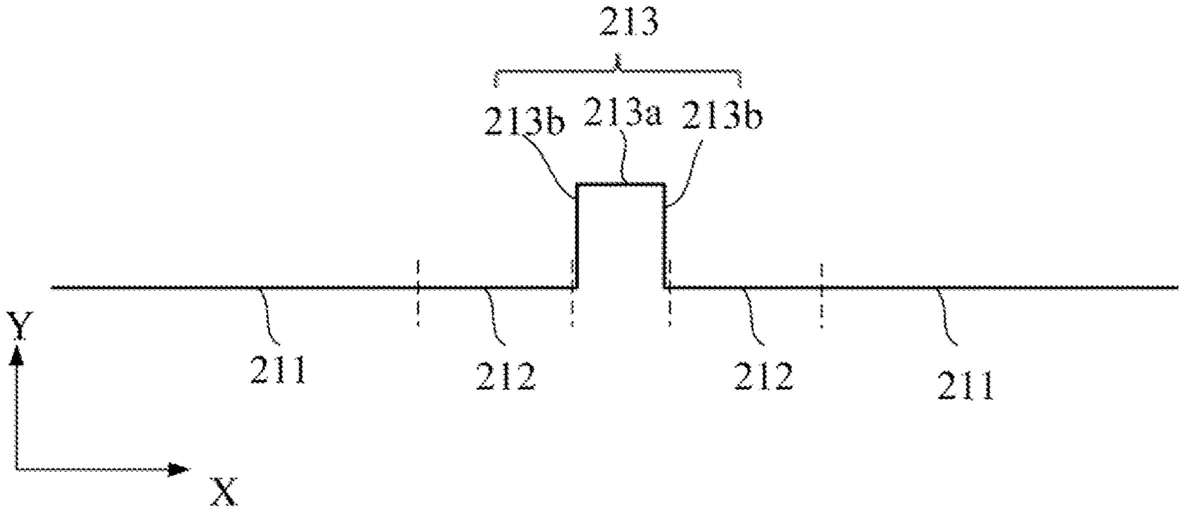
FIG. 14*b* is a schematic diagram of a first scanning signal line in FIG. 14*a*.

A first example: referring to FIGS. 14*a* and 14*b*, the hollow pattern formed in the blank region Q21 of the functional unit is rectangular or similarly rectangular, the winding region Q22 is arranged around the blank region Q21, the winding region Q22 is a rectangular ring, and other part is the circuit region Q23 of the functional unit. In FIG. 14*a*, a length of the blank region Q21 in the first direction X is less than a length of the blank region Q21 in the second direction Y. That is, the blank region Q21 is in a “1” shape. Only the circuit region Q23 is provided with the pixel driving circuit. The first line segment of the first scanning signal line 21 is located in the main display region Q1, and the second line segment of the first scanning signal line 21 is located in the circuit region Q23. Both of the first line segment and the second line segment extend in the first direction X, and the first line segment 211 and the second line segment 212 connected in a same straight line are electrically connected to each other. The third line segment 213 of the first scanning signal line 21 includes a first line sub-segment 213*a* extending in the first direction X and a second line sub-segment 213*b* extending in the second direction Y. Since the hollow pattern is rectangular or similarly rectangular, the third line segment of any one of the first scanning signal lines 21 includes one first line sub-segment 213*a* and two second line sub-segments 213*b*, and two ends of the first line sub-segment 213*a* are connected to the two second line sub-segments 213*b*, respectively. The first line sub-segment 213*a* is located on a side of the blank region Q21 in the second direction Y, and the two second line sub-segments 213*b* are located on two opposite sides of the blank region Q21 in the first direction X. In addition, the second line segment of the first scanning signal line 21 may extend from the circuit region Q23 to the winding region Q22, and be electrically connected to the second line sub-segment 213*b* of the third line segment 213.

In some examples, a plurality of first scanning signal lines 21 including a portion located in the main display region Q1 and a portion located in the functional region are provided, and in this case, the plurality of first scanning signal lines 21 are mirror-symmetrical, taking a straight line passing through the center of the blank region Q21 along the first direction X as a symmetry axis. That is, half of the first scanning signal lines 21 are routed on an upper side of the blank region Q21, and the other half of the first scanning signal lines 21 are routed on a lower side of the blank region Q21.

Figure 15:
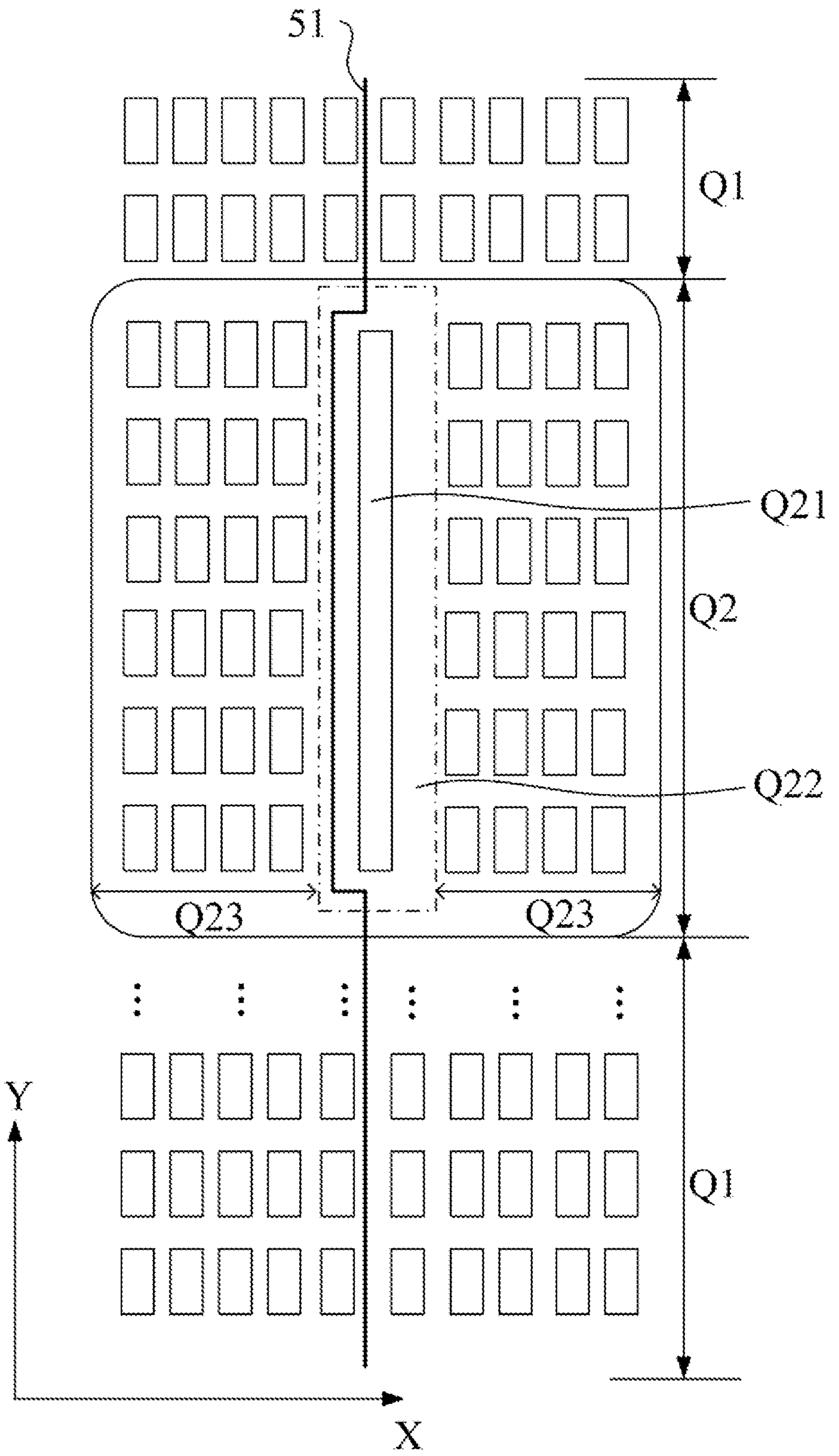
FIG. 15 is a schematic view of a part of a display substrate according to an embodiment of the disclosure.

Accordingly, as shown in FIG. 15, the first line segment of the data line 51 is located in the main display region Q1, and the second line segment is located in the circuit region Q23. Both of the first line segment and the second line segment extend in the second direction Y, and the first line segment and the second line segment in a same straight line in the second direction Y are electrically connected to each other. The third line segment of the data line 51 includes two first line sub-segments and one second line sub-segment, and two ends of the second line sub-segment are connected to the two first line sub-segments, respectively. The two first line sub-segments extend in the first direction X and are located on two sides of the blank region Q21 in the second direction Y, respectively. The second line sub-segment is located on a side of the blank region Q21 in the first direction X. In addition, it should be noted that the second line segment of the data line 51 may extend from the circuit region Q23 to the winding region Q22, and be electrically connected to the first line sub-segment of the third line segment. In some examples, a plurality of data line 51 including a portion located in the main display region Q1 and a portion located in the functional region are provided, and in this case, the plurality of data lines 51 are mirror-symmetrical, taking a straight line passing through the blank region Q21 in the second direction Y as a symmetry axis. That is, half of the data lines 51 are routed from the left side, and the other half of the data lines 51 are routed from the right side.

Figure 16:
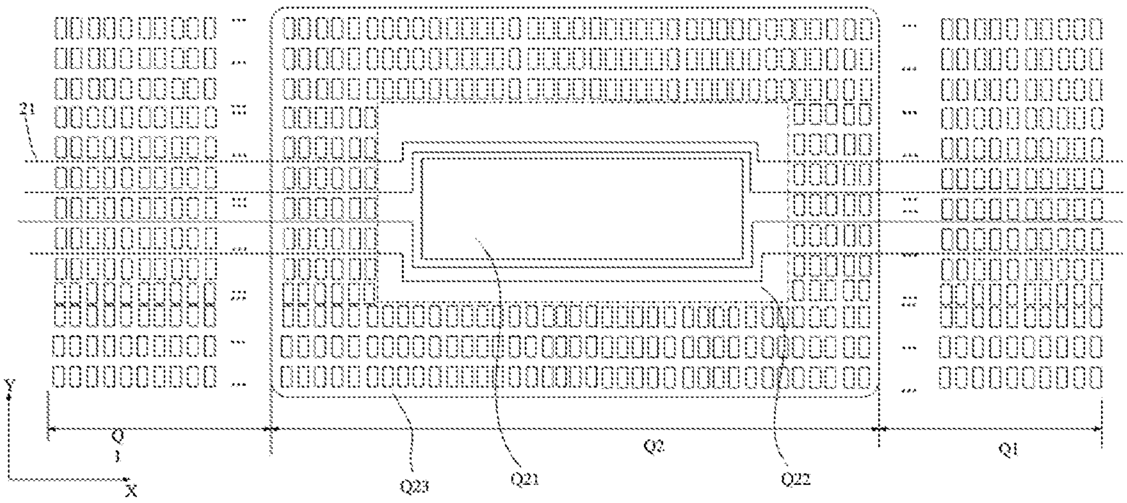
FIG. 16 is a schematic view of a part of a display substrate according to an embodiment of the disclosure.
Figure 17:
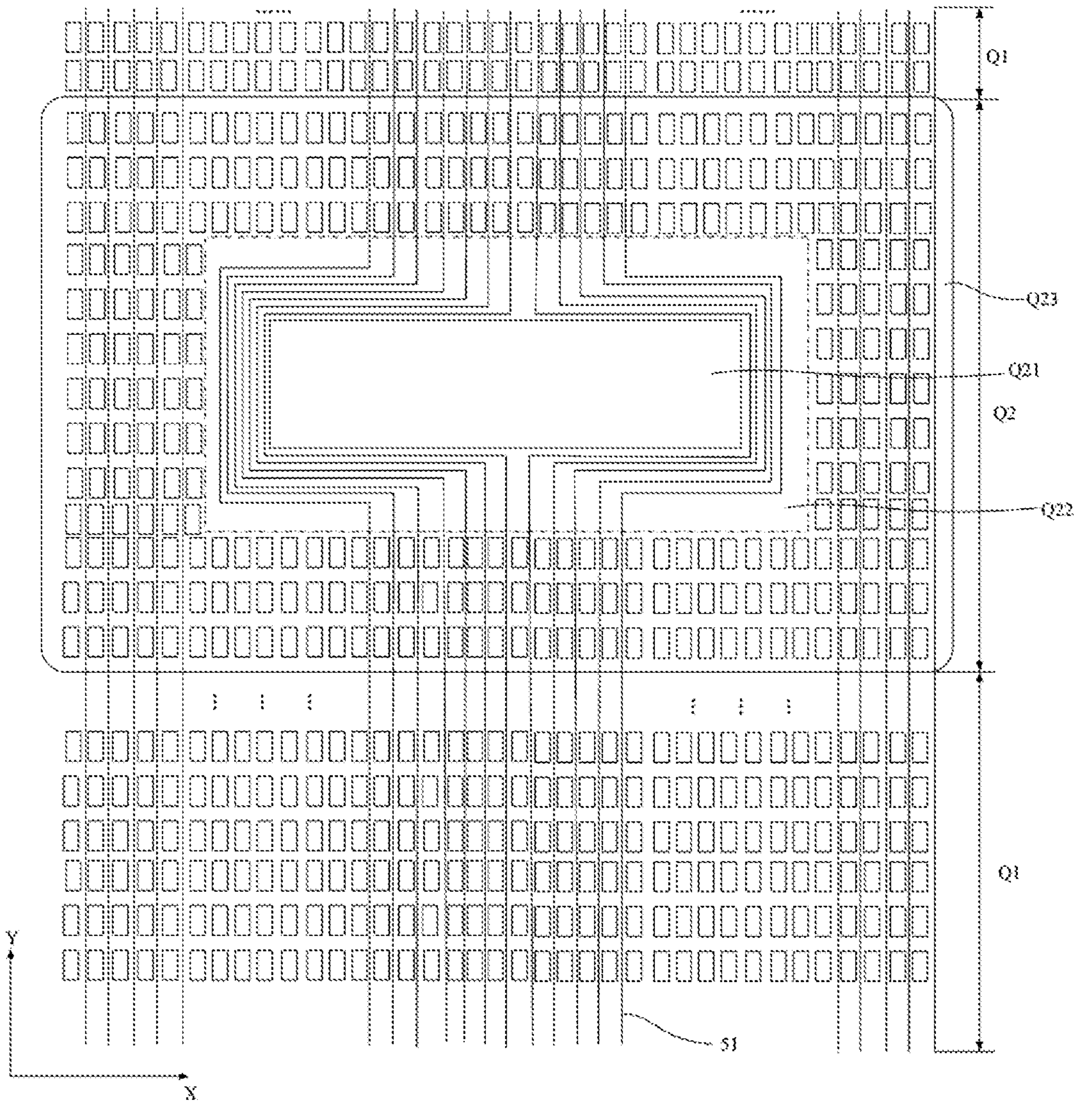
FIG. 17 is a schematic view of a part of a display substrate according to an embodiment of the disclosure.

A second example: the second example is similar to the first example except that the rectangle of the blank region Q21 is in the shape of a Chinese character “yi” (“一”, which means “one” in English), which is a line shape extending in the first direction X. Referring to FIGS. 16 and 17, where the blank region Q21 is in the shape of “ . ”, the first scanning signal line 21 and the data line 51 are routed in the same manner as that in the first example described above, and therefore, the description thereof will not be repeated.

Figure 18A:
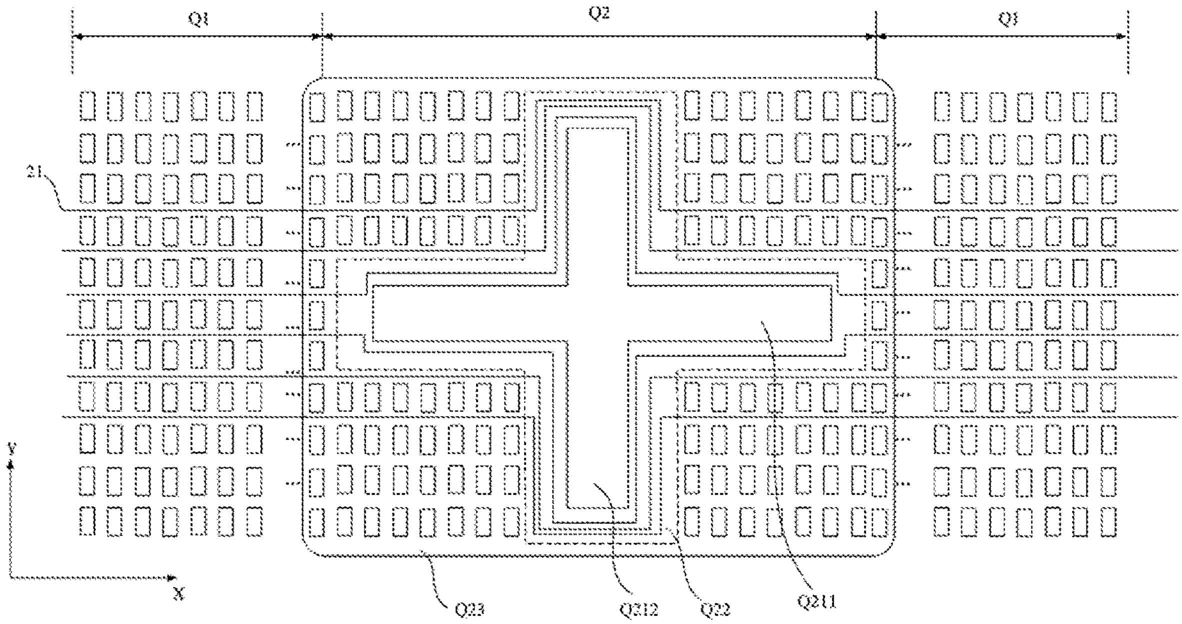
FIG. 18*a* is a schematic view of a part of a display substrate according to an embodiment of the disclosure.

A third example: referring to FIG. 18*a*, the hollow pattern formed in the blank region Q21 of the functional unit is cross-shaped or similarly cross-shaped. That is, the blank region Q21 includes a first blank region Q211 extending in the first direction X and a second blank region Q212 extending in the second direction Y. The winding region Q22 surrounds the blank region Q21 and is matched with the shape of the blank region Q21. In this case, the winding region Q22 is a cross-shaped ring, a part of the winding region Q22 extending in the first direction X is called a first winding region Q22, and a part of the winding region Q22 extending in the second direction Y is called a second winding region Q22. Other region except the blank region Q21 and the winding region Q22 in the functional unit is the circuit region Q23.

Figure 18B:
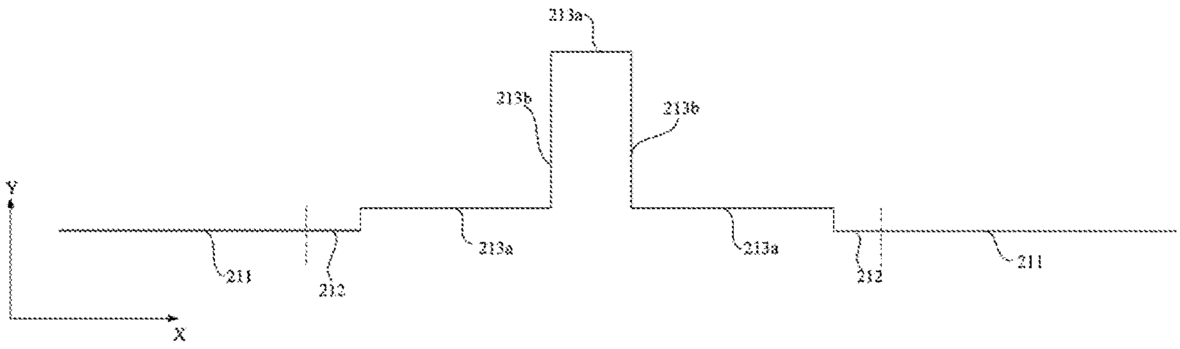
FIG. 18*b* is a schematic diagram of a first scanning signal line in FIG. 18*a*.

Specifically, referring to FIG. 18*b*, for the first scanning signal line 21 connected to the pixel driving circuits in the main display region Q1 and the circuit region Q23 covered by an extension region (formed by extending the first winding region Q22 along the first direction X) of the first winding region Q22 in the first direction X, the first line segment 211 of the first scanning signal line 21 is located in the main display region Q1, the second line segment 212 of the first scanning signal line 21 is located in the circuit region Q23, and the third line segment 213 is located in the first winding region Q22 and the second winding region Q22. The third line segment 213 includes two first line sub-segments 213*a* located in the first winding region Q22 and located on two sides of the second winding region Q22, two second line sub-segments 213*b* located at two opposite sides of the second winding region Q22 in the first direction X, and one first line sub-segment 213*a* located at a side of the second winding region Q22 in the second direction Y. The first line sub-segment 213*a* extends in the first direction X, and the second line sub-segment 213*b* extends in the second direction Y. In this case, the third line segment 213*b* is sequentially connected together in the format of a first line sub-segment located in the first winding region Q22, a second line sub-segment 213*b* located in the second winding region Q22, a first line sub-segment 213*a* located in the second winding region Q22, a second line sub-segment 213*b* located in the second winding region Q22, and a first line sub-segment 213*a* located in the first winding region Q22.

Figure 18C:
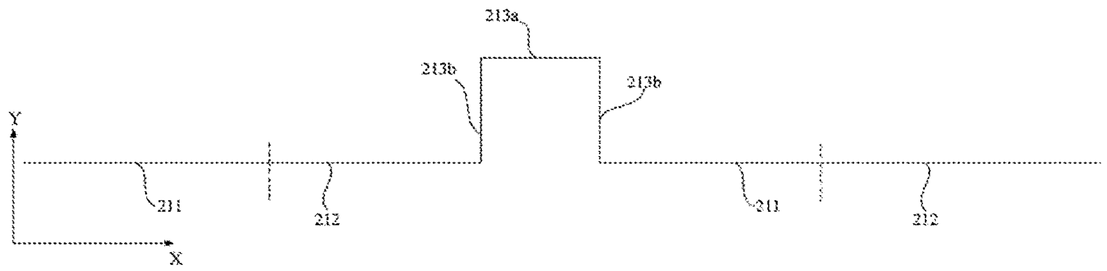
FIG. 18*c* is a schematic view of another first scanning signal line in FIG. 18*a*.

Referring to FIG. 18*c*, for the first scanning signal line 21 connected to the pixel driving circuits in the main display region Q1 and the circuit region Q23 covered by the extension region (formed by extending the second winding region Q22 along the first direction X) of the second winding region Q22 in the first direction X, the first line segment 211 of the first scanning signal line 21 is located in the main display region Q1, the second line segment 212 of the first scanning signal line 21 is located in the circuit region Q23, and the third line segment 213 of the first scanning signal line 21 is located in the second winding region Q22. Specifically, the third line segment 213 of the first scanning signal line 21 includes two second line sub-segments 213*b* located at two opposite sides of the second winding region Q22 in the first direction X, respectively, and one first line sub-segment 213*a* located at a side of the second winding region Q22 in the second direction Y. The first line sub-segment 213*a* electrically connects the two second line sub-segments 213*b* together. The first line sub-segment 213*a* extends in the first direction X, and the second line sub-segment 213*b* extends in the second direction Y. In addition, the second line segment 212 of the first scanning signal line 21 may extend from the circuit region Q23 to the winding region Q22, and be electrically connected to the second line sub-segment 212 of the third line segment.

In some examples, a plurality of first scanning signal lines 21 including a portion located in the main display region Q1 and a portion located in the functional region are provided, and in this case, the plurality of first scanning signal lines 21 are mirror-symmetrical, taking a straight line passing through the center of the blank region Q21 in the first direction X as a symmetry axis. That is, half of the first scanning signal lines 21 are routed on the upper side of the blank region Q21, and the other half of the first scanning signal lines 21 are routed on the lower side of the blank region Q21.

Figure 19:
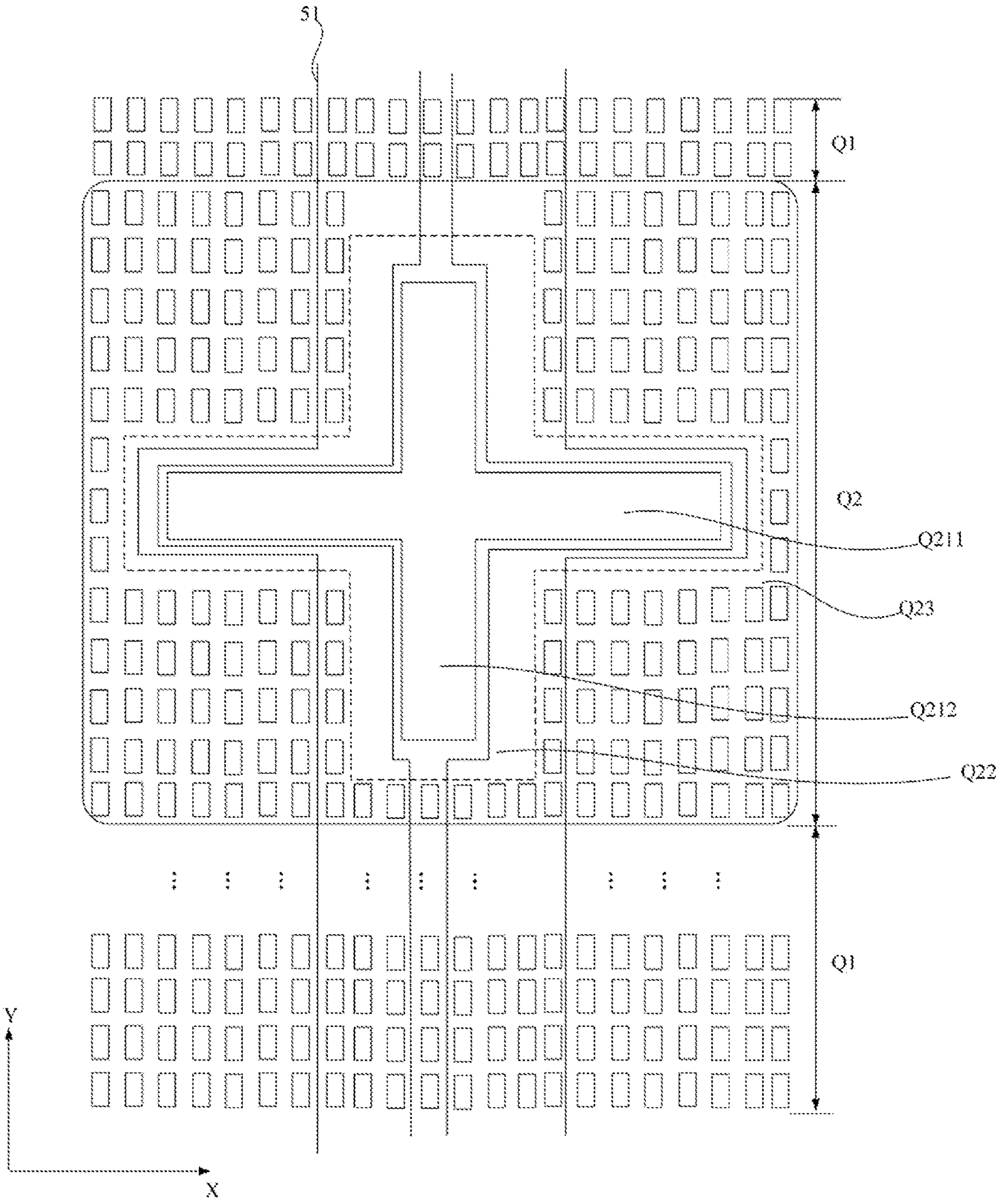
FIG. 19 is a schematic view of a part of a display substrate according to an embodiment of the disclosure.

Accordingly, referring to FIG. 19, for the data line 51 connected to the pixel driving circuits in the main display region Q1 and the circuit region Q23 covered by an extension region (formed by extending the second winding region Q22 along the second direction Y) of the second winding region Q22 in the second direction Y, the first line segment of the data line 51 is located in the main display region Q1, the second line segment of the data line 51 is located in the circuit region Q23, and the third line segment is located in the first winding region Q22 and the second winding region Q22. The third line segment includes two second line sub-segments located in the second winding region Q22 and located on two sides of the first winding region Q22, two first line sub-segments located at two sides of the first winding region Q22 in the second direction Y, and one second line sub-segment located at a side of the first winding region Q22 in the first direction X. The first line sub-segment extends in the first direction X, and the second line sub-segment extends in the second direction Y. In this case, the third line segment is sequentially connected together in the format of a second line sub-segment located in the second winding region Q22, a first line sub-segment located in the first winding region Q22, a second line sub-segment located in the first winding region Q22, and a second line sub-segment located in the second winding region Q22. For the data line 51 connected to the pixel driving circuits in the main display region Q1 and the circuit region Q23 covered by an extension region (formed by extending the first winding region Q22 along the second direction Y) of the first winding region Q22 in the second direction Y, the first line segment of the data line 51 is located in the main display region Q1, the second line segment is located in the circuit region Q23, and the third line segment is located in the first winding region Q22. Specifically, the third line segment of the data line 51 includes two opposite first line sub-segments located at two sides of the first winding region Q22 in the second direction Y, respectively, and one second line sub-segment located at a side of the first winding region Q22 in the second direction Y. The first line sub-segment extends in a first direction X, and the second line sub-segment extends in a second direction Y. The third line segment is sequentially connected together in a format of a first line sub-segment, a second line sub-segment and a first line sub-segment. In addition, it should be noted that the second line segment of the data line 51 may extend from the circuit region Q23 to the winding region Q22, and be electrically connected to the first line sub-segment of the third line segment.

In some examples, a plurality of data lines 51 including a portion located in the main display region Q1 and a portion located in the functional region are provided, and in this case, the data lines 51 are mirror-symmetrical, taking a straight line passing through the blank region Q21 in the second direction Y as a symmetry axis. That is, half of the data lines 51 are routed on the left side, and the other half of the data lines 51 are routed on the right side.

Figure 20:
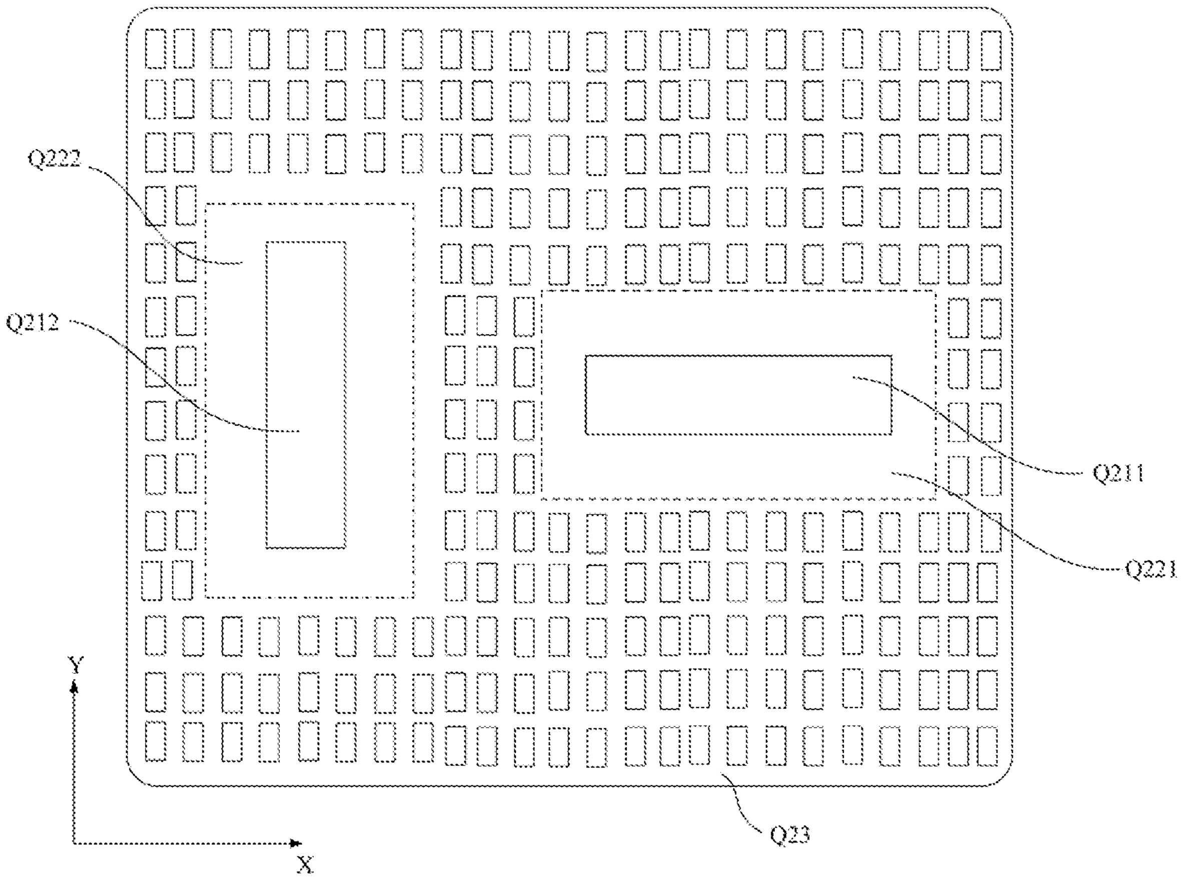
FIG. 20 is a schematic view of a part of a display substrate according to an embodiment of the disclosure.

A fourth example: referring to FIG. 20, the blank regions Q21 in each functional unit also include a first blank region Q211 extending in the first direction X and a second blank region Q212 extending in the second direction Y, but the first blank region Q211 and the second blank region Q212 do not intersect. The corresponding winding region Q22 includes a first winding region Q221 surrounding the first blank region Q211 and a second winding region Q222 surrounding the second blank region Q212. In this case, the first scanning signal line 21 and the data line 51 are routed in the first blank region Q211 in the same manner as in the first example, and are routed in the second blank region Q212 in the same manner as in the second example. Therefore, the description thereof is not repeated herein.

It should be noted that, although the routing method corresponding to the shapes of the blank regions Q21 is described above, the shape of the blank region Q21 may be in a "⊥" shape, a "|||" shape, or the like in the actual product. Since the blank regions Q21 of the "工" and the "|||" shapes each include the first blank region Q211 extending in the first direction X and the second blank region Q212 extending in the second direction Y, the routing of the first signal lines is performed with reference to the above example for the existence of the two blank regions Q21.

In some examples, regardless of any of the above cases, where the third line segment of the first signal line includes a first line sub-segment along the first direction X and a second line sub-segment along the second direction Y, the first line sub-segment and the second line sub-segment may have a one-piece structure. That is, the first line sub-segment and the second line sub-segment are directly electrically connected together. In this case, the first line sub-segment and the second line sub-segment are made of the same material, so that they may be formed in the same patterning process. Alternatively, in some examples, the first line sub-segment extending in the first direction X and the second line sub-segment extending in the second direction Y in the third line segment may be distributed in two conductive layers, respectively. For example, the first conductive layer includes the first line sub-segment, the second conductive layer includes the second line sub-segment, an interlayer insulating layer is arranged between the first conductive layer and the second conductive layer, and the first line sub-segment and the second line sub-segment may be electrically connected together through a via penetrating through the interlayer insulating layer.

In some examples, regardless of any of the above cases, a line spacing between the third line segments of the first signal lines is less than a line spacing between the first line segments of the first signal lines, and the line spacing between the first line segments may be equal to a line spacing between the second line segments of the first signal lines.

In some examples, pixel driving circuits are provided in both the main display region Q1 and the circuit region Q23 in the functional region of the display substrate, and an arrangement density of the pixel driving circuits is the same. For example, the pixel driving circuits in the display substrate may be arranged in an array, and it is enough that only the winding region Q22 and the blank region Q21 is not provided with the pixel driving circuit. In this case, the pixel driving circuits in the main display region Q1 and the circuit region Q23 are arranged in the same pattern, which facilitates the manufacturing of the pixel driving circuits.

In some examples, the display substrate includes not only the above described structure but also a plurality of light emitting devices, such as OLED devices, and each pixel driving circuit is configured to drive one light emitting device to emit light. Since no pixel driving circuit is arranged in the blank region Q21 and the winding region Q22 in the functional region of the display substrate, in a case where the pixel driving circuits in the main display region Q1 and in the circuit region Q23 are arranged in the same pattern, if the areas of the anodes of the light emitting devices of the same color in the main display region Q1 and the functional region are the same, arrangement densities of the light emitting devices in the main display region Q1 and in the functional region are different. Specifically, the arrangement density of the light emitting devices in the main display region Q1 is greater than that in the functional region. The arrangement density of the light emitting devices means the number of light emitting devices of any one same color in the same region per unit area. The larger the number is, the greater the density is. Alternatively, where the arrangement density of the light emitting devices in the main display region Q1 is greater than that in the functional region, the sizes of the anodes of the light emitting devices having the same color in the main display region Q1 and the functional region may alternatively be different. For example, the size of the anode of the light emitting device in the functional region is larger than that of the light emitting device in the main display region Q1.

In some examples, an orthographic projection of anodes of at least a part of the light emitting devices in the display substrate on the base substrate covers the blank region Q21. That is, the pattern of the anodes with the orthographic projections covering the blank region Q21 determines the outline format of the hollow pattern.

Figure 21:
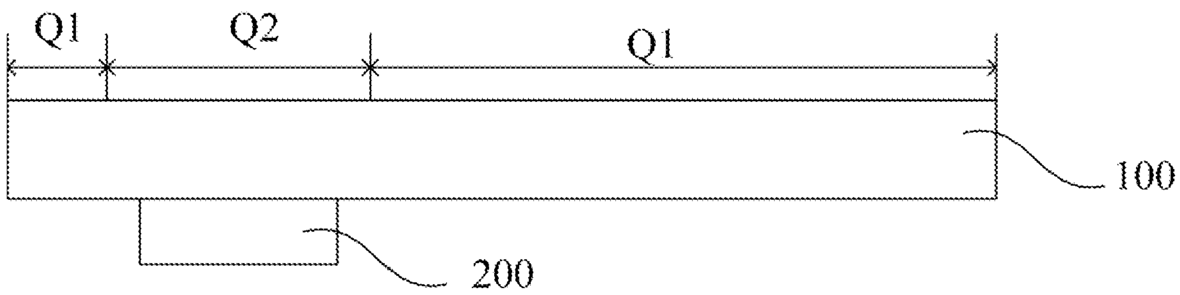
FIG. 21 is a schematic diagram of an electronic apparatus according to an embodiment of the disclosure.

FIG. 21 is a schematic diagram of an electronic apparatus according to an embodiment of the disclosure. In a second aspect, as shown in FIG. 21, an embodiment of the present disclosure provides a display electronic apparatus, which includes any one of the display substrates 100 and the functional component 200. The functional component 200 is located on a side of the display substrate 100 away from a light emitting surface, and the functional component 200 and the hollow pattern in the functional region of the display substrate 100 overlap with each other in the embodiment of the present disclosure. In this case, the functional component 200 may be matched with the hollow patterns to realize the functions thereof.

In some examples, the functional component 200 may specifically be at least one of a camera, a distance sensor, a fingerprint sensor, a near field communication (NFC) antenna, a radio frequency chip, and the like.

Where the functional component 200 is a camera, the functional region may include only one functional unit, the blank region in the functional unit forms the hollow pattern, and an orthographic projection of the camera on the base substrate is within an orthographic projection of the hollow pattern on the base substrate. That is, an orthographic projection of a conductive element (for example, a first scanning line, a second scanning line, a data line, an anode of a light emitting device, etc.) in any conductive layer in the display substrate 100 on the base substrate does not overlap the orthographic projection of the camera on the base substrate, thereby ensuring an image capturing function of the camera.

Where the functional component 200 is a distance sensor, the electronic apparatus may realize a distance measuring function. In this case, the orthographic projection of the hollow pattern in the functional unit on the base substrate may partially overlap an orthographic projection of the distance sensor on the base substrate, but the distance measuring function of the distance sensor is not affected. In an embodiment, the orthographic projection of the hollow pattern on the base substrate covers the orthographic projection of the distance sensor on the base substrate, so that an influence of a signal sent by the distance sensor during the distance sensor is working on an operation of the display device is avoided.

Where the functional component 200 is a fingerprint sensor, the functional region may include a plurality of functional units. Each functional unit is correspondingly provided with one fingerprint sensor. An orthographic projection of each fingerprint sensor on the base substrate may partially overlap the orthographic projection of one hollow pattern on the base substrate, as long as it is ensured that light emitted by the light emitting device irradiates onto the finger and then be reflected to the fingerprint sensor, thereby realizing the function of fingerprint identification.

Where the functional component 200 is a near field communication antenna, the functional region may include only one functional unit, the blank region in the functional unit forms the hollow pattern, and an orthographic projection of the near field communication antenna on the base substrate is within an orthographic projection of the hollow pattern on the base substrate, so as to avoid signal radiation of the near field communication antenna from affecting the operation of the display device.

Where the functional component 200 is a radio frequency chip, an orthographic projection of the radio frequency chip on the base substrate may at least partially overlap the orthographic projection of the hollow pattern in the functional region on the base substrate. In this case, a microwave signal transmitted by the radio frequency chip may be subjected to frequency selection through the hollow pattern in the functional region, so as to realize radiation of the microwave signal in a specific frequency band.

Only several functional components 200 are described in the above, but this does not limit the protection scope of the embodiments of the present disclosure.

The electronic apparatus may be any product or component having a display function, such as a mobile phone, a tablet computer, a television, a monitor, a notebook computer, a digital photo frame, a navigator, etc., but the embodiment of the present invention is not limited thereto.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and scope of the present disclosure, and such modifications and improvements are also considered to be within the scope of the present disclosure.

What is claimed is:

1. A display substrate having a display region, wherein the display region comprises a functional region and a main display region surrounding the functional region; the functional region has at least one functional unit; each of the at least one functional unit has a blank region, a winding region and a circuit region;

the display substrate comprises a base substrate, and a plurality of conductive layers on the base substrate; the plurality of conductive layers form at least one hollow pattern, and each of the at least one hollow pattern is in the blank region;

the plurality of conductive layers comprise a first signal line, and the first signal line comprises a first line segment in the main display region, a second line segment in the circuit region and a third line segment in the winding region;

wherein extending directions of the first line segment and the second line segment are the same, the third line segment electrically connects the first line segment and the second line segment together, and the third line segment comprises at least two line sub-segments with different extending directions, wherein the light emitting devices each comprise a first anode on the base substrate; and the first anode is connected to an anode connection electrode in a third conductive layer through a second via penetrating through a second planarization layer, the anode connection electrode is connected to a connection electrode through a first via penetrating through a first planarization layer, and the connection electrode is connected to a region of an active layer through a third via penetrating through a first insulating layer, a second insulating layer and a third insulating layer, wherein the active layer, the third insulating layer, the second insulating layer, the first insulating layer, the connection electrode, the first planarization layer, the anode connection electrode, the second planarization layer, and a second anode are stacked in sequence away from the base substrate, such that among the active layer, the third insulating layer, the second insulating layer, the first insulating layer, the connection electrode, the first planarization layer, the anode connection electrode, the second planarization layer, and the second anode, the active layer is closest to the base substrate, and the second anode is farthest from the base substrate.

2. The display substrate according to claim 1, wherein in the functional unit, the winding region surrounds the blank region, and the circuit region surrounds the winding region; and the first line segment, the second line segment and the third line segment of the first signal line are directly and electrically connected together.

3. The display substrate according to claim 1, wherein the plurality of conductive layers comprise a first conductive layer and a second conductive layer on the base substrate;

the first conductive layer comprises first type signal lines each having a main body part extending in a first direction, and the first type signal lines comprise a first sub-type signal line and a second sub-type signal line; the first sub-type signal line is only in the main display region; and the second sub-type signal line is in both the main display region and the winding region;

the second conductive layer comprises second type signal lines each having a main body part extending in a second direction, and the second type signal lines comprise a third sub-type signal line and a fourth sub-type signal line; the third sub-type signal line is only in the main display region; and the fourth sub-signal line is in both the main display region and the winding region; and the first signal line comprises the second sub-type signal line and/or the fourth sub-type signal line.

4. The display substrate according to claim 3, wherein the third line segment comprises a first line sub-segment extending in the first direction and a second line sub-segment extending in the second direction.

5. The display substrate according to claim 4, wherein the first line sub-segment and the second line sub-segment of the third line segment are directly electrically connected together.

6. The display substrate according to claim 4, wherein the first conductive layer comprises the first line sub-segment, the second conductive layer comprises the second line sub-segment, and the first line sub-segment and the second line sub-segment of the third line segment are electrically connected together through a via penetrating through an interlayer insulating layer.

7. The display substrate according to claim 3, wherein the first signal line is the second sub-type signal line, and the second sub-type signal line is arranged in mirror symmetry, taking a straight line passing through a center of the functional region and extending in the first direction as a symmetry axis; or the first signal line is the fourth sub-signal line, and the fourth sub-signal line is arranged in mirror symmetry, taking a straight line passing through the center of the functional region and extending in the second direction as a symmetry axis.

8. The display substrate according to claim 3, wherein the first type signal lines comprise at least one of a gate line, a reset signal line, and a light emitting control line.

9. The display substrate according to claim 3, wherein the second type signal lines comprise at least one of a data line, an initial signal line, and a power supply signal line.

10. The display substrate according to claim 1, wherein a spacing between the third line segments is less than a spacing between the first line segments.

11. The display substrate according to claim 1, further comprising pixel driving circuits in the main display region and the circuit region, where a distribution density of the pixel driving circuits in the main display region is the same as a distribution density of the pixel driving circuits in the circuit region.

12. The display substrate according to claim 1, further comprising light emitting devices in the main display region and the functional region, wherein a distribution density of the light emitting devices in the main display region is greater than a distribution density of the light emitting devices in the functional region.

13. The display substrate according to claim 1, further comprising light emitting devices in the main display region and the functional region; for the light emitting devices of a same color, an area of the anode of the light emitting device in the main display region is less than an area of the anode of the light emitting device in the functional region.

14. The display substrate according to claim 13, wherein a part of the anodes of the light emitting devices partially cover the blank region.

15. An electronic apparatus, comprising the display substrate according to claim 1 and a functional component, wherein the functional component at least partially overlaps the hollow pattern.

16. The electronic apparatus according to claim 15, wherein in the functional unit, the winding region surrounds the blank region, and the circuit region surrounds the winding region; and the first line segment, the second line segment and the third line segment of the first signal line are directly and electrically connected together.

17. The electronic apparatus according to claim 15, wherein the plurality of conductive layers comprise a first conductive layer and a second conductive layer on the base substrate;

the first conductive layer comprises first type signal lines each having a main body part extending in a first direction, and the first type signal lines comprise a first sub-type signal line and a second sub-type signal line; the first sub-type signal line is only in the main display region; and the second sub-type signal line is in both the main display region and the winding region;

the second conductive layer comprises second type signal lines each having a main body part extending in a second direction, and the second type signal lines comprise a third sub-type signal line and a fourth sub-type signal line; the third sub-type signal line is only in the main display region; and the fourth sub-signal line is in both the main display region and the winding region;

the first signal line comprises the second sub-type signal line and/or the fourth sub-type signal line; and orthographic projections of the functional component and the first signal line on the base substrate do not overlap each other.

18. The electronic apparatus according to claim 17, wherein the third line segment comprises a first line sub-segment extending in the first direction and a second line sub-segment extending in the second direction.

19. The electronic apparatus according to claim 15, further comprising light emitting devices in the main display region and the functional region; for the light emitting devices of a same color, an area of the anode of the light emitting device in the main display region is less than an area of the anode of the light emitting device in the functional region.

20. The electronic apparatus according to claim 19, wherein a part of the anodes of the light emitting devices partially cover the blank region; and orthographic projections of the functional component and the anode on the base substrate do not overlap each other.

* * * * *